United States Patent
Marnfeldt

(10) Patent No.: US 12,551,690 B2
(45) Date of Patent: Feb. 17, 2026

(54) DIGITAL-TO-ANALOG CONVERTER CIRCUITRY FOR A STIMULATOR DEVICE HAVING NON-LINEAR AMPLITUDE ADJUSTMENT

(71) Applicant: Boston Scientific Neuromodulation Corporation, Valencia, CA (US)

(72) Inventor: Goran N. Marnfeldt, Valencia, CA (US)

(73) Assignee: Boston Scientific Neuromodulation Corporation, Valencia, CA (US)

( * ) Notice: Subject to any disclaimer, the term of this patent is extended or adjusted under 35 U.S.C. 154(b) by 840 days.

(21) Appl. No.: 17/185,411

(22) Filed: Feb. 25, 2021

(65) Prior Publication Data

US 2021/0275798 A1 Sep. 9, 2021

Related U.S. Application Data

(60) Provisional application No. 62/984,587, filed on Mar. 3, 2020.

(51) Int. Cl.
| | |
|---|---|
| *A61N 1/18* | (2006.01) |
| *A61N 1/02* | (2006.01) |
| *A61N 1/36* | (2006.01) |

(52) U.S. Cl.
CPC ......... *A61N 1/025* (2013.01); *A61N 1/36153* (2013.01); *A61N 1/36157* (2013.01)

(58) Field of Classification Search
CPC .... A61N 1/025; A61N 1/0534; A61N 1/0551; A61N 1/36062; A61N 1/36125; A61N 1/36153; A61N 1/36157

(Continued)

(56) References Cited

U.S. PATENT DOCUMENTS

| | | |
|---|---|---|
| 3,646,940 A | 3/1972 | Timm et al. |
| 3,724,467 A | 4/1973 | Avery et al. |

(Continued)

FOREIGN PATENT DOCUMENTS

| | | |
|---|---|---|
| EP | 1449561 | 8/2004 |
| WO | 2000/076436 | 12/2000 |

(Continued)

OTHER PUBLICATIONS

Invitation to Pay Additional Fees regarding corresponding PCT Application No. PCT/US2021/019641, mailed Jun. 15, 2021.

(Continued)

*Primary Examiner* — Jon Eric C Morales
(74) *Attorney, Agent, or Firm* — Lewis & Reese, PLLC

(57) ABSTRACT

Digital-to-Analog Converter (DAC) circuitry useable in a stimulator device is disclosed. The DAC circuitry produces an output current whose magnitude varies as a function of an amplitude value provided by a digital amplitude bus. The relationship of the output current to the amplitude (Iout(A)) may be linear or non-linear depending on the current-voltage characteristics of a circuit in the DAC that is selected for use. For example, if a resistor is selected, the output current will vary linearly with amplitude; if a p-n diode is selected, the output current will vary exponentially with amplitude. The shape of Iout(A) affects the resolution of the output current, and depending on the circuit selected, can cause the resolution to be constant, or at least more constant, over the dynamic range of the DAC circuitry. The DAC circuitry is further beneficial in its ability to be programmed with a minimum and maximum output current.

19 Claims, 16 Drawing Sheets

(58) Field of Classification Search
USPC .......................................................... 607/59
See application file for complete search history.

(56) References Cited

U.S. PATENT DOCUMENTS

| | | | |
|---|---|---|---|
| 3,822,708 A | 7/1974 | Zilber | |
| 4,532,930 A | 8/1985 | Crosby et al. | |
| 4,592,359 A | 6/1986 | Galbraith | |
| 4,628,934 A | 12/1986 | Pohndorf et al. | |
| 5,344,429 A | 9/1994 | Smits | |
| 5,470,341 A | 11/1995 | Kuehn et al. | |
| 5,522,865 A | 6/1996 | Schulman et al. | |
| 5,603,726 A | 2/1997 | Schulman et al. | |
| 5,649,970 A | 7/1997 | Loeb et al. | |
| 5,757,167 A | 5/1998 | Arora et al. | |
| 5,804,957 A | 9/1998 | Coln | |
| 6,038,477 A | 3/2000 | Kayyali | |
| 6,161,042 A | 12/2000 | Hartley et al. | |
| 6,181,969 B1 | 1/2001 | Gord | |
| 6,301,505 B1 | 10/2001 | Money | |
| 6,381,496 B1 | 4/2002 | Meadows et al. | |
| 6,473,653 B1 | 10/2002 | Schallhorn et al. | |
| 6,516,227 B1 | 2/2003 | Meadows et al. | |
| 6,690,974 B2 | 2/2004 | Archer et al. | |
| 6,895,280 B2 | 5/2005 | Meadows et al. | |
| 7,024,246 B2 | 4/2006 | Acosta et al. | |
| 7,127,298 B1 | 10/2006 | He et al. | |
| 7,177,698 B2 | 2/2007 | Klosterman et al. | |
| 7,180,760 B2 | 2/2007 | Varrichio et al. | |
| 7,444,181 B2 | 10/2008 | Shi et al. | |
| 7,532,936 B2 | 5/2009 | Erickson et al. | |
| 7,539,538 B2 | 5/2009 | Parramon et al. | |
| 7,881,803 B2 | 2/2011 | Parramon et al. | |
| 8,606,362 B2 | 12/2013 | He et al. | |
| 8,620,436 B2 | 12/2013 | Parramon et al. | |
| 9,002,465 B2 | 4/2015 | Ranu | |
| 9,259,574 B2 | 2/2016 | Aghassian et al. | |
| 9,308,373 B2 | 4/2016 | Lee | |
| 9,656,081 B2 | 5/2017 | Feldman et al. | |
| 10,071,239 B2 | 9/2018 | Parramon et al. | |
| 10,525,253 B2 | 1/2020 | Marnfeldt et al. | |
| 2003/0093130 A1 | 5/2003 | Stypulkowski | |
| 2005/0245978 A1 | 11/2005 | Varrachio et al. | |
| 2007/0038250 A1* | 2/2007 | He ....................... A61N 1/0551 607/2 |
| 2007/0293914 A1 | 12/2007 | Woods et al. | |
| 2008/0319497 A1 | 12/2008 | Griffith et al. | |
| 2010/0042187 A1 | 2/2010 | Werder et al. | |
| 2012/0095529 A1 | 4/2012 | Parramon et al. | |
| 2013/0204319 A1 | 8/2013 | Trier et al. | |
| 2015/0231402 A1 | 8/2015 | Aghassian | |
| 2015/0360038 A1 | 12/2015 | Zottola et al. | |
| 2016/0051817 A1 | 2/2016 | Popovic et al. | |
| 2018/0071512 A1 | 3/2018 | Feldman et al. | |
| 2018/0071513 A1 | 3/2018 | Weiss et al. | |
| 2018/0071520 A1 | 3/2018 | Weerakoon et al. | |
| 2018/0071527 A1 | 3/2018 | Feldman et al. | |
| 2018/0140831 A1 | 5/2018 | Feldman et al. | |
| 2019/0083796 A1 | 3/2019 | Weerakoon et al. | |
| 2019/0175915 A1 | 6/2019 | Brill et al. | |
| 2019/0269920 A1 | 9/2019 | Khalil et al. | |
| 2019/0275331 A1 | 9/2019 | Zhu | |
| 2019/0299006 A1 | 10/2019 | Marnfeldt | |
| 2019/0329024 A1 | 10/2019 | Kothandaraman et al. | |
| 2021/0275798 A1 | 9/2021 | Marnfeldt | |

FOREIGN PATENT DOCUMENTS

| | | |
|---|---|---|
| WO | 2005/101627 | 10/2005 |
| WO | 2021/003290 A1 | 1/2021 |
| WO | 2021/119741 A1 | 6/2021 |

OTHER PUBLICATIONS

International Search Report and Written Opinion regarding corresponding PCT Application No. PCT/US2021/019641, mailed Aug. 6, 2021.
Second Office Action regarding corresponding Chinese Patent Application No. 202180010162.1, mailed Jul. 17, 2024.
Extended European Search Report Regarding Corresponding EP Application No. 25174152.6, mailed Jul. 2, 2025.

* cited by examiner

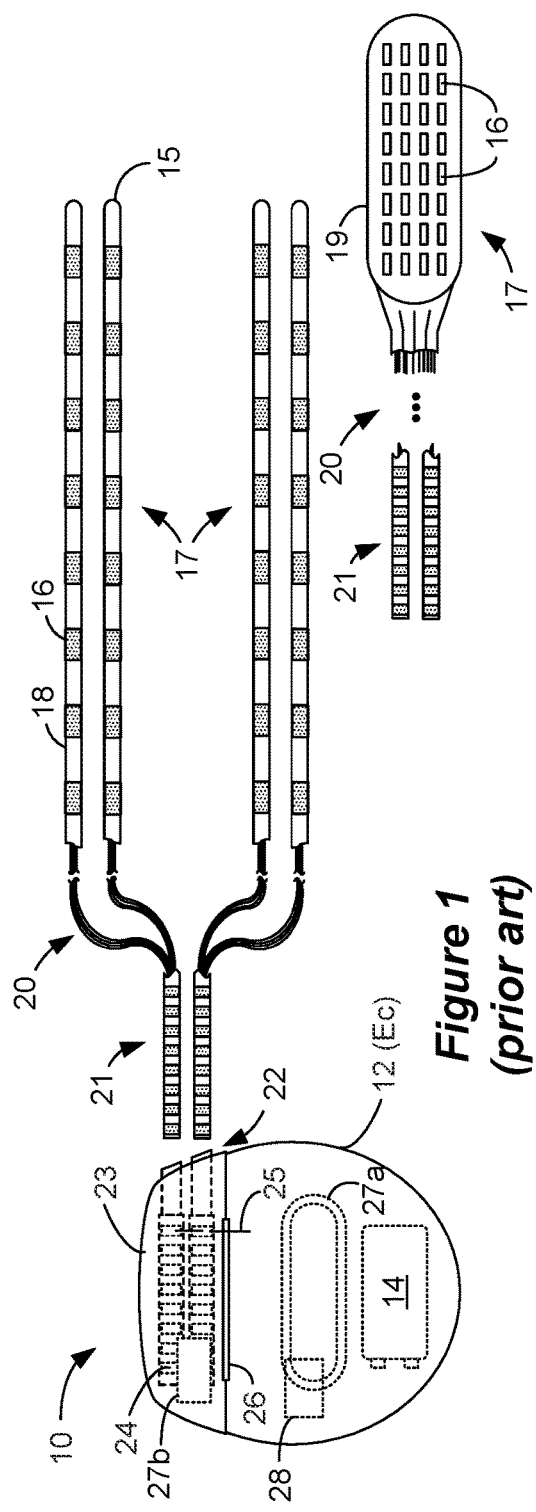
*Figure 1 (prior art)*
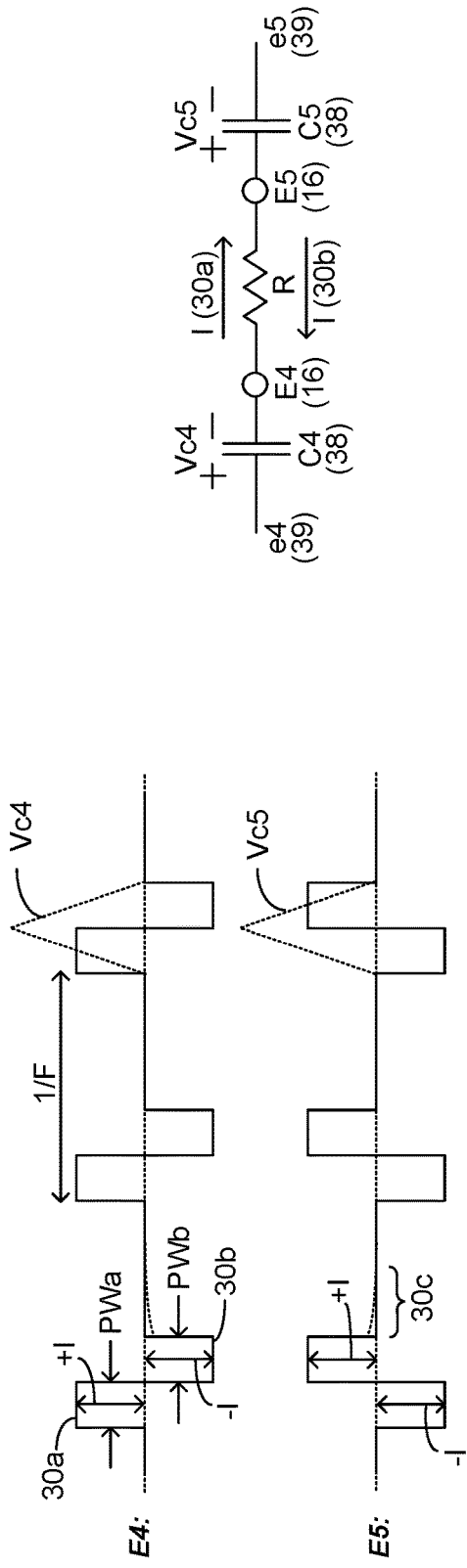
*Figure 2A (prior art)*
*Figure 2B (prior art)*

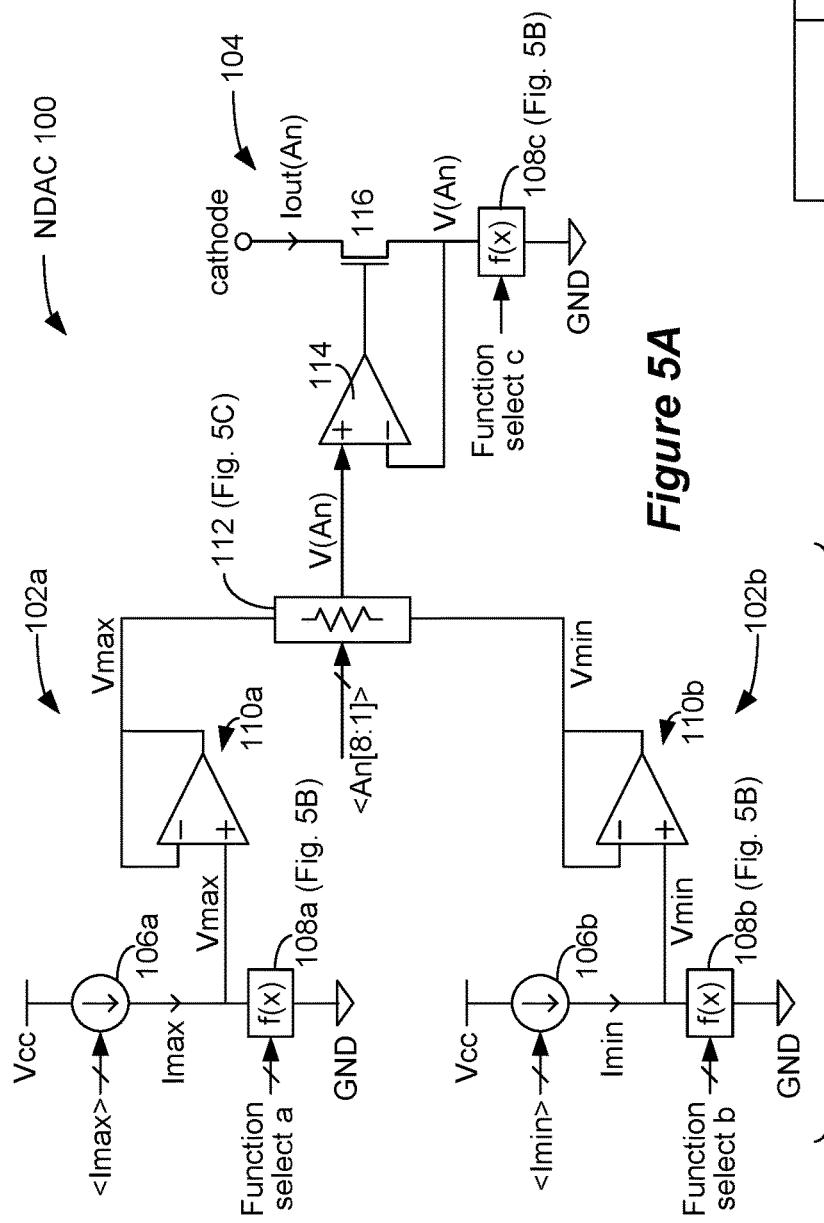
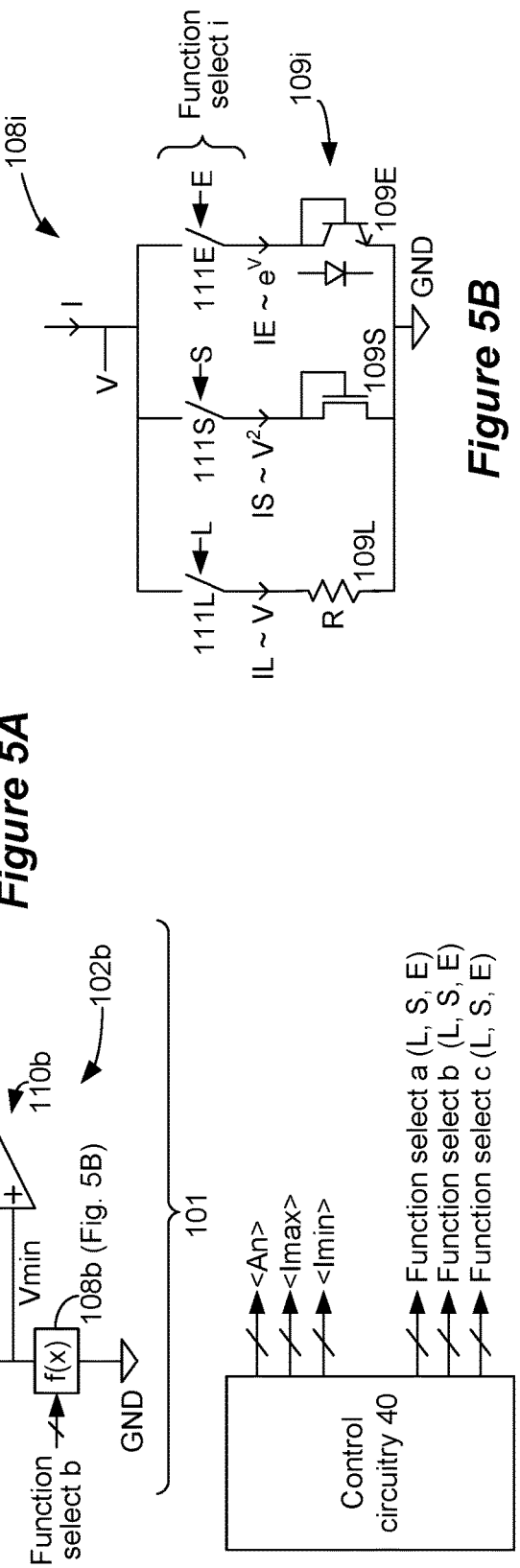
*Figure 5A*
*Figure 5B*

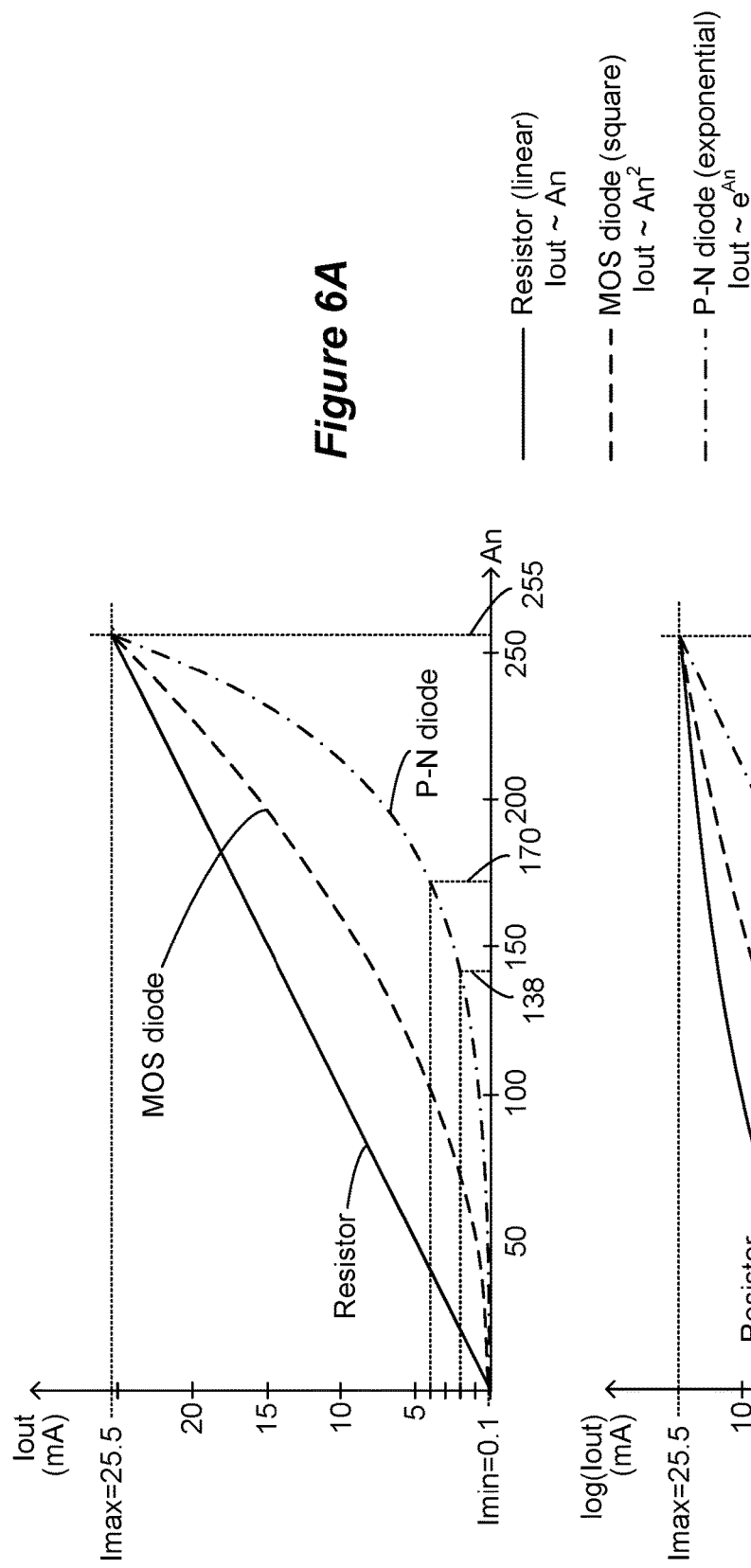
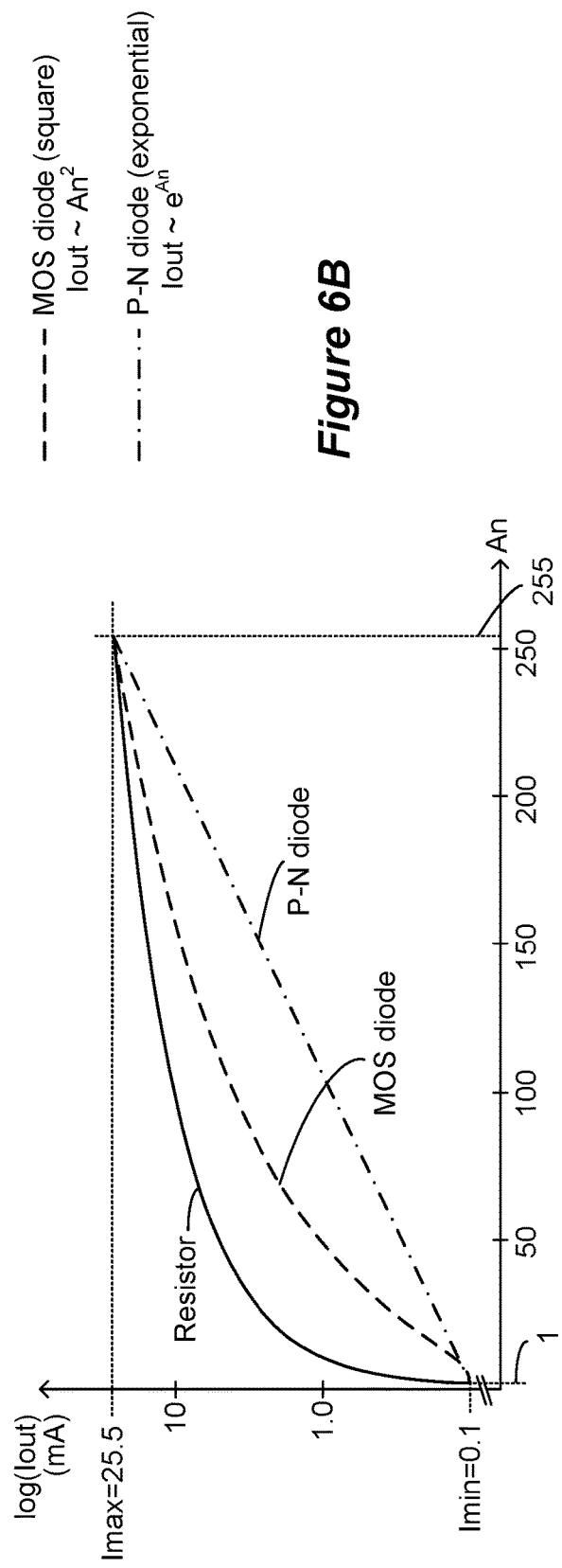
*Figure 6A*
*Figure 6B*

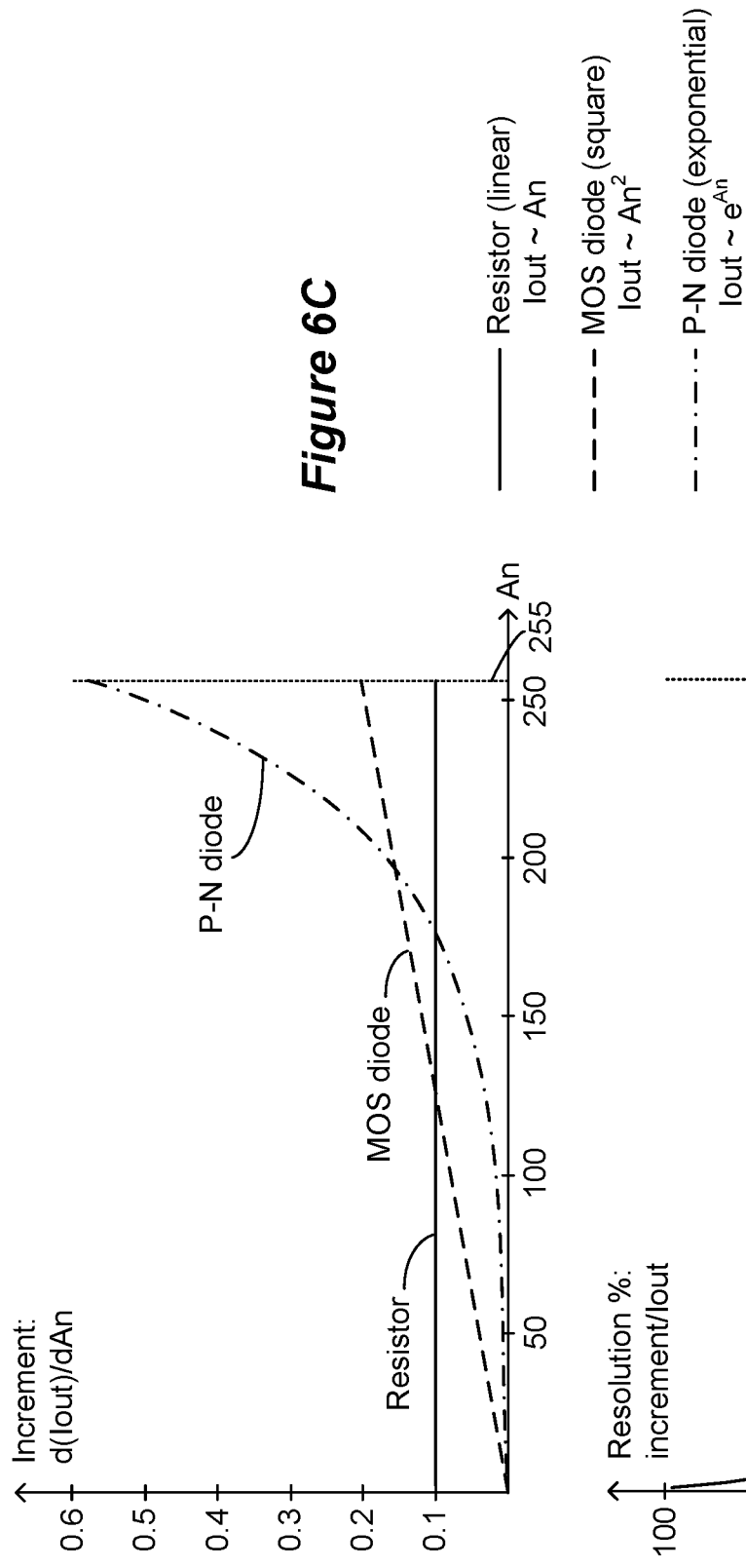
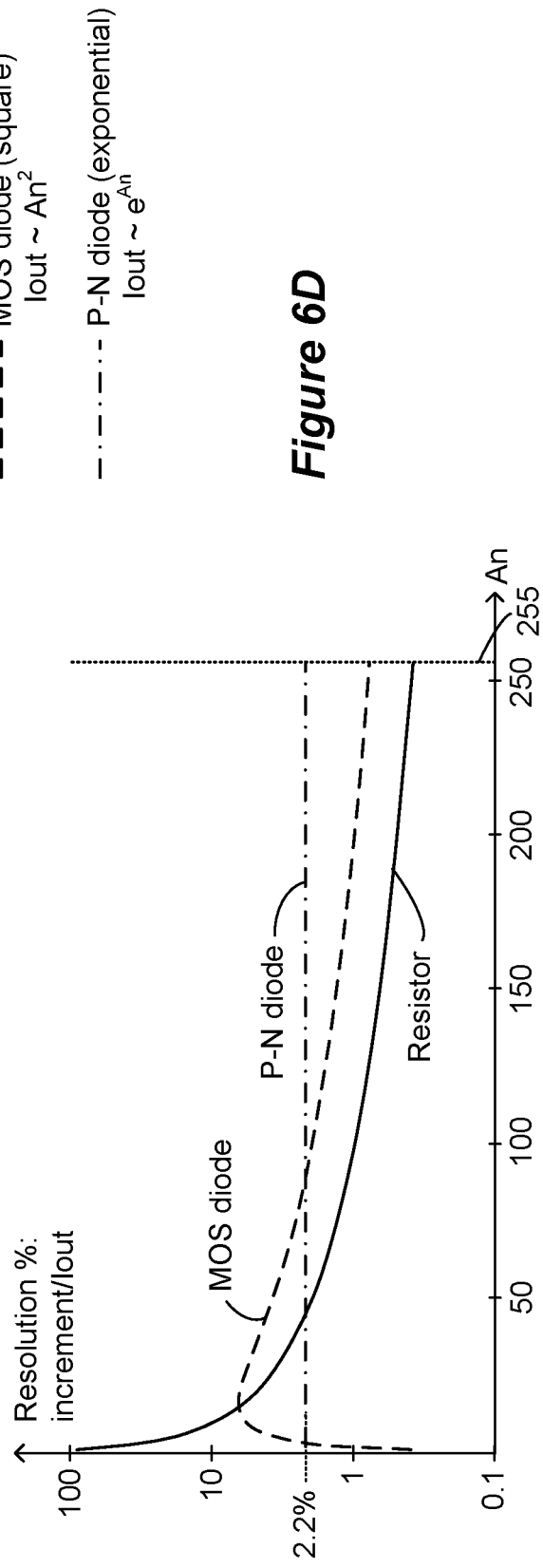
*Figure 6C*
*Figure 6D*

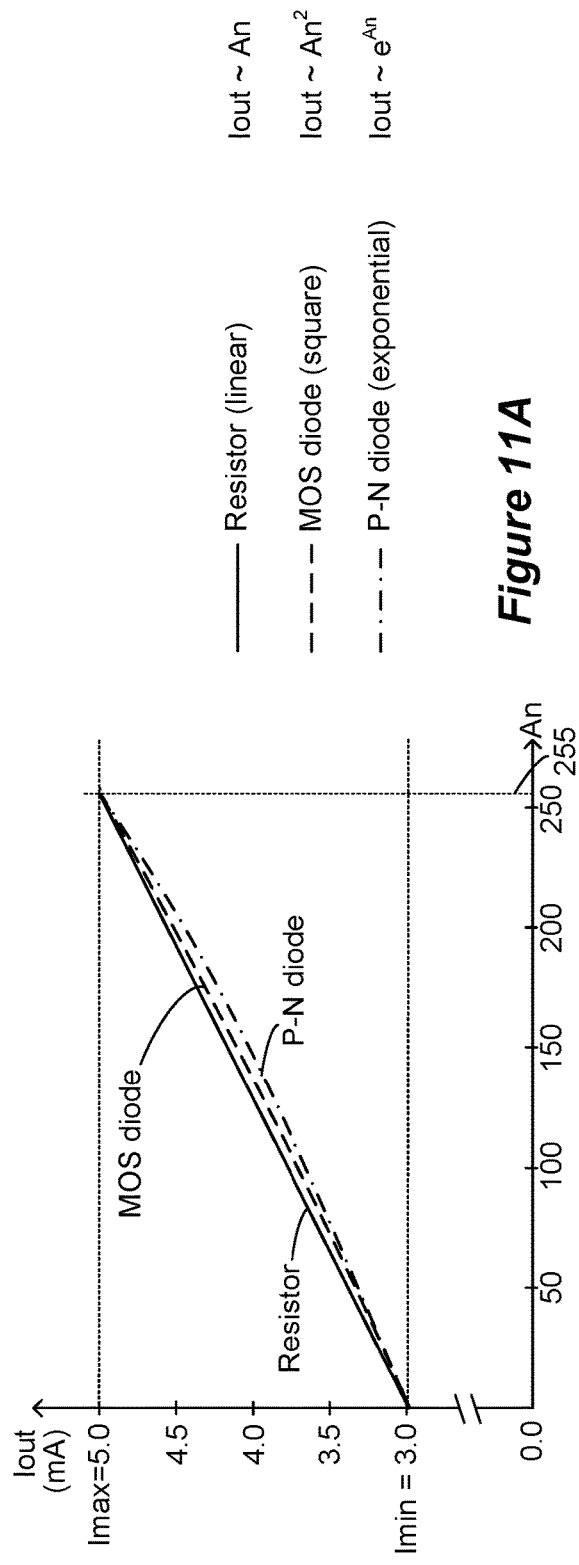
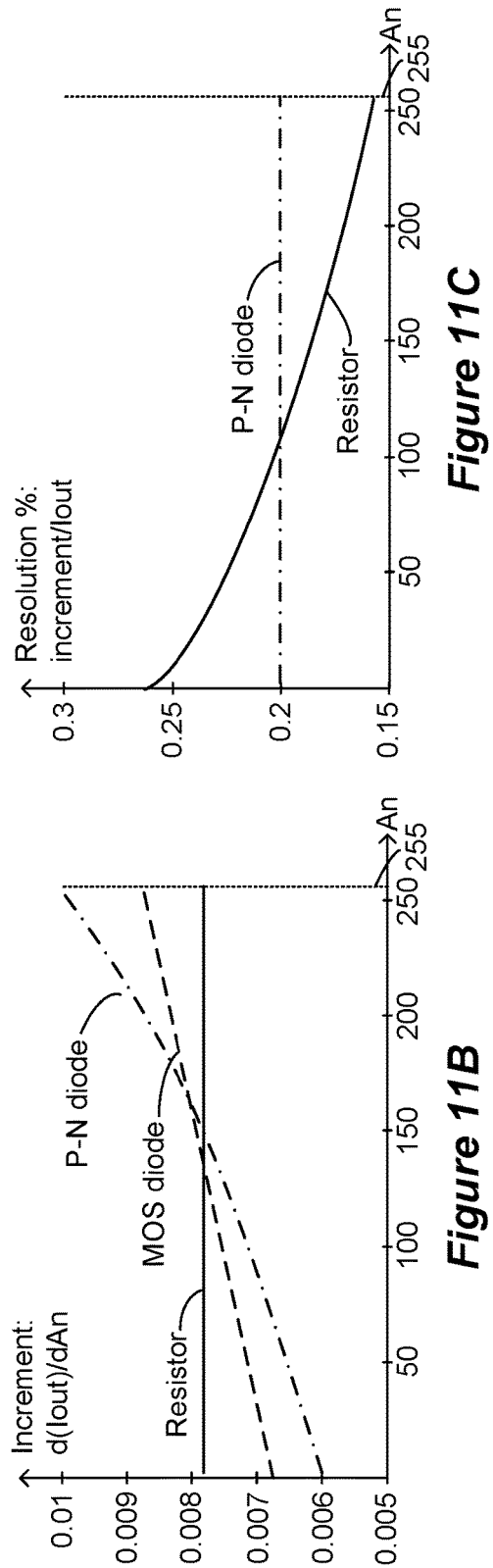
*Figure 11A*
*Figure 11B*
*Figure 11C*

DIGITAL-TO-ANALOG CONVERTER CIRCUITRY FOR A STIMULATOR DEVICE HAVING NON-LINEAR AMPLITUDE ADJUSTMENT

CROSS REFERENCE TO RELATED APPLICATIONS

This is a non-provisional application of U.S. Provisional Patent Application Ser. No. 62/984,587, filed Mar. 3, 2020, which is incorporated by reference in its entirety, and to which priority is claimed.

FIELD OF THE INVENTION

This application relates to implantable stimulator devices, and in particular to the current source circuitry used to provide therapeutic currents at the electrodes of the device.

INTRODUCTION

Implantable neurostimulator devices are devices that generate and deliver electrical stimuli to nerves and tissues for the therapy of various biological disorders, such as pacemakers to treat cardiac arrhythmia, defibrillators to treat cardiac fibrillation, cochlear stimulators to treat deafness, retinal stimulators to treat blindness, muscle stimulators to produce coordinated limb movement, spinal cord stimulators to treat chronic pain, cortical and deep brain stimulators to treat motor and psychological disorders, and other neural stimulators to treat urinary incontinence, sleep apnea, shoulder subluxation, etc. The description that follows will generally focus on the use of the invention within a Spinal Cord Stimulation (SCS) system or a Deep Brain Stimulation (DBS) system. However, the present invention may find applicability with any implantable neurostimulator device system.

An SCS or DBS system typically includes an Implantable Pulse Generator (IPG) 10 shown in FIG. 1. The IPG 10 includes a biocompatible device case 12 that holds the circuitry and a battery 14 for providing power for the IPG to function. The IPG 10 is coupled to tissue-stimulating electrodes 16 via one or more electrode leads that form an electrode array 17. For example, one or more percutaneous leads 15 can be used having ring-shaped or split-ring electrodes 16 carried on a flexible body 18. In another example, a paddle lead 19 provides electrodes 16 positioned on one of its generally flat surfaces. Lead wires 20 within the leads are coupled to the electrodes 16 and to proximal contacts 21 insertable into lead connectors 22 fixed in a header 23 on the IPG 10, which header can comprise an epoxy for example. Once inserted, the proximal contacts 21 connect to header contacts 24 within the lead connectors 22, which are in turn coupled by feedthrough pins 25 through a case feedthrough 26 to stimulation circuitry 28 within the case 12.

In the illustrated IPG 10, there are thirty-two electrodes (E1-E32), split between four percutaneous leads 15, or contained on a single paddle lead 19, and thus the header 23 may include a 2×2 array of eight-electrode lead connectors 22. However, the type and number of leads, lead connectors, and electrodes in an IPG is application-specific and therefore can vary. The conductive case 12 can also comprise an electrode (Ec). In a SCS application, the electrode lead(s) are typically implanted in the spinal column proximate to the dura in a patient's spinal cord, and the IPG is typically implanted under the skin in the buttocks region. In a DBS application, the electrode leads are typically implanted in particular regions of the brain, and the IPG is typically implanted under the skin under the clavicle (collarbone). In other IPG examples designed for implantation directly at a site requiring stimulation, the IPG can be lead-less, having electrodes 16 instead appearing on the body of the IPG 10 for contacting the patient's tissue. The IPG lead(s) can be integrated with and permanently connected to the IPG 10 in other solutions. The goal of neurostimulation therapy is to provide electrical stimulation from the electrodes 16 to alleviate a patient's symptoms, such as chronic back pain in an SCS application, or tremors in a DBS application.

IPG 10 can include an antenna 27a allowing it to communicate bi-directionally with a number of external devices used to program or monitor the IPG, such as a hand-held patient remote controller or a clinician programmer. See, e.g., U.S. Patent Application Publications 2015/0360038 and 2015/0231402. Antenna 27a as shown comprises a conductive coil within the case 12, although the coil antenna 27a can also appear in the header 23. When antenna 27a is configured as a coil, communication with external devices preferably occurs using near-field magnetic induction. IPG 10 may also include a Radio-Frequency (RF) antenna 27b. In FIG. 1, RF antenna 27b is shown within the header 23, but it may also be within the case 12. RF antenna 27b may comprise a patch, slot, or wire, and may operate as a monopole or dipole. RF antenna 27b preferably communicates using far-field electromagnetic waves, and may operate in accordance with any number of known RF communication standards, such as Bluetooth, Zigbee, MICS, and the like. If the battery 14 is rechargeable, the IPG 10 may further include a charging coil (not shown) to wirelessly receive energy from an external charging device.

Stimulation in IPG 10 is typically provided by pulses, and each pulse may include a number of phases, as shown in the example of FIG. 2A. Stimulation parameters for the pulses typically include magnitude (current I, although a voltage amplitude V can also be used); frequency (F); pulse width (PW) of the pulses or of its individual phases; the electrodes 16 selected to provide the stimulation; and the polarity of such selected electrodes, i.e., whether they act as anodes that source current to the tissue or cathodes that sink current from the tissue. These and possibly other stimulation parameters taken together comprise a stimulation program that the stimulation circuitry 28 in the IPG 10 can execute to provide therapeutic stimulation to a patient.

In the example of FIG. 2A, electrode E4 has been selected as an anode (during its first phase 30a), and thus provides pulses which source a positive current of magnitude +I to the tissue. Electrode E5 has been selected as a cathode (again during first phase 30a), and thus provides pulses which sink a corresponding negative current of magnitude −I from the tissue. This is an example of bipolar stimulation, in which only two lead-based electrodes are used to provide stimulation to the tissue (one anode, one cathode). However, more than one electrode may be selected to act as an anode at a given time, and more than one electrode may be selected to act as a cathode at a given time. The case electrode Ec (12) can also be selected as an electrode, or current return, in what is known as monopolar situation.

IPG 10 as mentioned includes stimulation circuitry 28 to form prescribed stimulation at a patient's tissue. FIG. 3A shows an example of stimulation circuitry 28, which includes Digital-to-Analog converters (DACs) that provide an analog currents at the electrodes in accordance with specified magnitudes as explained further below. The stimulation circuitry 28 depicted includes a plurality of current source circuits (PDACs) and a plurality of current sink circuits (NDACs), so named in accordance with the Positive (sourced, anodic) and Negative (sunk, cathodic) currents they respectively issue. In the example shown, a NDACi/PDACi pair is dedicated (hardwired) to a particular electrode node ei, each of which is connected to one of the electrodes Ei 16 via DC-blocking capacitors Ci 38, for the reasons explained below. The stimulation circuitry 28 in this example also supports selection of the conductive case 12 as an electrode (Ec 12), which case electrode is typically selected for monopolar stimulation. While the PDACs and NDACs are assumed in this disclosure to comprise current sources able to provide a prescribed constant current, they can also comprise voltage sources able to provide a prescribed constant voltage.

Power for the stimulation circuitry 28 is provided by a compliance voltage VH. As described in further detail in U.S. Patent Application Publication 2013/0289665, the compliance voltage VH can be produced by a compliance voltage generator 29, which can comprise a circuit used to boost the battery 14's voltage (Vbat) to a voltage VH sufficient to drive the prescribed current I through the tissue R. The compliance voltage generator 29 may comprise an inductor-based boost converter or can comprise a capacitor-based charge pump, as explained in U.S. Patent Application Publication 2018/0071512 for example. Because the resistance of the tissue is variable, VH may also be variable, and can be as high as 18 Volts in one example. Although not shown, U.S. Patent Application Publications 2018/0071520 explains that the PDACs and the NDACs can be powered by different power supply domains. For example, the PDACs can be powered using a first power supply domain, which includes VH as the high supply and VH-Vcc as the low supply (both of which may vary, because VH may vary). The NDACs can be powered using a second power supply domain, which includes Vcc as the high supply and ground (GND) as the low supply.

Proper control of the stimulation circuitry 28 allows any of the electrodes 16 to act as an anode or a cathode to create a current through a patient's tissue, R, hopefully with good therapeutic effect. The magnitude of the current provided by each NDACi is controlled via a digital amplitude bus $<Ani>$, thus allowing its associated electrode Ei to act as a cathode electrode to sink a current of the prescribed magnitude from the tissue. Likewise, the magnitude of the current provided by each PDACi is controlled via a digital amplitude bus $<Api>$, thus allowing its associated electrode Ei to act as an anode electrode to source a current of the prescribed magnitude to the tissue.

The digital amplitude buses $<Ani>$ and $<Api>$, as well as other digital control signals for the DACs, can be issued by digital control circuitry 40 in the IPG 10. Digital control circuitry 40 can comprise a microcontroller, such as Part Number MSP430, manufactured by Texas Instruments, which is described in data sheets at http://www.ti.com/lsds/ti/microcontroller/16-bit_msp430/overview.page?DCMP=MCU_other& HQS=msp430. Control circuitry 40 more generally can comprise a microprocessor, Field Programmable Grid Array, Programmable Logic Device, Digital Signal Processor or like devices, and may include a central processing unit capable of executing instructions, with such instructions stored in volatile or non-volatile memory within or associated with the control circuitry. Digital control circuitry 40 can be separate from the stimulation circuitry 28; for example each may be formed in their own integrated circuits. Alternatively, the digital control circuitry 40 and stimulation circuitry 28 may also be integrated on the same integrated circuit, such as an Application Specific Integrated Circuit (ASIC). Various examples of digital control circuitry 40 and stimulation circuitry 28, and how they can be connected or integrated, are provided in U.S. Patent Application Publications 2008/0319497, 2012/0095529, 2018/0071513, 2018/0071520, or 2019/0083796, which are incorporated herein by reference in their entireties.

FIG. 3A shows programming of the stimulation circuitry 28 as necessary to create the first phase 30a of FIG. 2A, in which electrodes E4 and E5 are selected as an anode and cathode respectively to create a current of magnitude I through the tissue. In this example, digital amplitude bus $<Ap4>$ serving PDAC4 is set with amplitude value X corresponding to the desired current magnitude I, as is bus $<An5>$ servicing NDAC5. These buses would be asserted at particular times to produce the desired current, I, with the correct timing (e.g., in accordance with the prescribed frequency F and pulse width PWa). During the second phase 30b (PWb), PDAC5 and NDAC4 would be similarly programmed via digital amplitude buses $<Ap5>$ and $<An4>$ to reverse the polarity of the current, as is useful during the production of biphasic pulses, discussed further below. Other digital amplitude buses used to program PDACs and NDACs associated with other non-active electrodes (e.g., $<Ap1>$ and $<An1>$ associated with PDAC1 and NDAC1 at electrode E1) would be set to zero, or these PDACs or NDACs could be inactivated by other means. More than one anode electrode and more than one cathode electrode may be selected at one time through appropriate control of the DACs, and thus current can flow through the tissue R between two or more of the electrodes 16.

Also shown in FIG. 3A are DC-blocking capacitors Ci 38 placed in series in the electrode current paths between each of the electrode nodes ei 39 and the electrodes Ei 16 (including the case electrode Ec 12). The DC-blocking capacitors 38 act as a safety measure to prevent DC current injection into the patient, as could occur for example if there is a circuit fault in the stimulation circuitry 28.

Although not shown, circuitry in the IPG 10 including the stimulation circuitry 28 can also be included in an External Trial Stimulator (ETS) device which is used to mimic operation of the IPG during a trial period and prior to the IPG 10's implantation. An ETS is typically used after an electrode array 17 has been implanted in the patient. The proximal ends of the leads in the electrode array 17 pass through an incision in the patient and are connected to the externally-worn ETS, thus allowing the ETS to provide stimulation to the patient during the trial period. An ETS can include various antennas for communicating with external devices, similarly to the IPG 10. Further details concerning an ETS device are described in U.S. Pat. No. 9,259,574 and U.S. Patent Application Publication 2019/0175915.

Referring again to FIG. 2A, the stimulation pulses as shown are biphasic, with each pulse at each electrode comprising a first phase 30a followed thereafter by a second phase 30b of opposite polarity. Biphasic pulses are useful to actively recover any charge that might be stored on capacitive elements in the electrode current paths, such as the DC-blocking capacitors 38, the electrode/tissue interface, or within the tissue itself. To recover all charge by the end of the second pulse phase 30b of each pulse (Vc4=Vc5=0V), the first and second phases 30a and 30b are preferably charged balanced at each electrode, with the phases comprising an equal amount of charge but of the opposite polarity. In the example shown, such charge balancing is achieved by using the same pulse width (PWa=PWb) and the same magnitude ($|+I|=|-I|$) for each of the pulse phases 30a and 30b. However, the pulse phases 30a and 30b may also be charged balance if the product of the magnitude and pulse widths of the two phases 30a and 30b are equal, as is known.

FIG. 3A shows that stimulation circuitry 28 can include passive recovery switches 41$_i$, which are described further in U.S. Patent Application Publications 2018/0071527 and 2018/0140831. Passive recovery switches 41$_i$ may be attached to each of the electrode nodes 39, and are used to passively recover any remaining charge, such as may remain on the DC-blocking capacitors Ci 38 after issuance of the second pulse phase 30b. Passive charge recovery occurs without actively driving a current using the DAC circuitry, and can be prudent, because non-idealities in the stimulation circuitry 28 may lead to active charge recovery that is not perfectly charge balanced. Passive charge recovery typically occurs during a phase 30c (FIG. 2A), which may comprise a portion of the quiet periods between the pulses, by closing passive recovery switches 41i connected to the electrode nodes 39 at one end. The other end of the switches 41$_i$ are connected to a common reference voltage, which in this example comprises the voltage of the battery 14, Vbat, although another reference voltage could be used. As explained in the above-cited references, passive charge recovery tends to equilibrate the charge on the DC-blocking capacitors 38 and other capacitive elements in the output current paths by placing the capacitors in parallel between the reference voltage (Vbat) and the patient's tissue. Note that passive charge recovery is illustrated as small exponentially-decaying curves during 30c in FIG. 2A, which may be positive or negative depending on whether pulse phase 30a or 30b imparts a predominance of charge at a given electrode. Although not illustrated, control of the passive recovery switches can occur via signals output by the digital control circuitry 40.

Other designs for stimulation circuitries 28 can be used in the IPG 10, and FIG. 3A is just one example. In another example shown in FIG. 3B, PDACs and NDACs may not be dedicated to work with particular electrodes. Instead, a switching matrix (SM Pi) can intervene between each PDACi and the electrode nodes ei 39, and a switching matrix (SM Ni) can intervene between each NDACi and the electrode nodes ei 39. Each switching matrix can be controlled by a digital switch bus (e.g., <Sp1>, <Sn1>, etc.) to control the electrode node to which its associated DAC's output (e.g., PDAC1, NDACI, etc.) should be connected. Depending on the design, and unlike what is shown in FIG. 3B, stimulation circuitry 28 may include only one PDAC (and one switching matrix SM P) and only one NDAC (and one switching matrix SM N). However, providing more than one PDAC and more than one NDAC (e.g., 'x' of each, as shown in FIG. 3B) allows for the formation of more complex stimulation, such as stimulation requiring the simultaneous control of the current at more than one anode or cathode electrode, or stimulation formed in different timing channels. In the example of FIG. 3B, the digital control circuitry 40 would issue the digital amplitude buses for each PDAC and NDAC (e.g., <Ap1>, <An1>, etc.), as well as the digital switch buses (e.g., <Sp1>, <Sn1>, etc.) for each switching matrix, in accordance with the stimulation program the IPG 10 is programmed to execute. Still other variations of stimulation circuitry 28 are possible, and different options are disclosed in U.S. Pat. Nos. 6,181,969, 8,606,362, 8,620,436, and U.S. Patent Application Publications 2018/0071520 and 2019/0083796.

FIG. 4 shows example circuitry for a given NDAC and PDAC, such as those used in FIGS. 3A and 3B, although again the PDACs and NDACs can be built differently as the references just cited explain. The magnitude of the current output by the NDAC, as noted earlier, is controlled by a digital amplitude bus <An[8:1]>, which in this example comprises eight digital control signals An[8]–An[1] capable of representing 256 different amplitude values. Each of these digital control signals is input to a selection transistor 56n, each of which is in series with a differing number of transistors 54n connected in parallel. A reference current Iref is produced by a generator 50n, and is provided to a transistor 52n, which mirrors its current to each of the transistors 54n. (Such current mirroring occurs because the gates of transistor 52n and transistors 54n are connected to transistor 52n's drain, as is well known).

The number of parallelled transistors 54n varies in binary fashion, such that An[1] controls connection of one transistor 54n to provide Iref; An[2] controls connection of two transistors 54n which together provide 2*Iref; An[3] controls connection of four transistors 54n which together provide 4*Iref, and so on, with An[8] controlling connection of 128 transistors 54n which together provide 128*Iref. Because selection transistors 56n are N-channel transistors in this example, the digital control signals An[i] are preferably active high. Therefore, for example, if the digital amplitude bus <An[8:1]>='00110101', i.e., the number 53 in binary, control signals An[6], An[5], An[3], and An[1] are asserted to close their associated selection transistors 56n. These control signals respectively cause 32*Iref, 16*Iref, 4*Iref, and Iref to be sunk to the NDAC (e.g., either from the NDAC's associated electrode node (FIG. 3A) or to the NDAC's associated switch matrix (FIG. 3B)), for a total of 53*Iref. If it is assumed then that Iref=0.1 mA, the current Iout sunk would equal 5.3 mA. In short, by asserting various of the digital control signals in the digital amplitude bus <An[8:1]>, output currents Iout over a dynamic range from Iref=0.0 mA ('00000000') to 255*Iref=25.5 mA ('11111111') can be sunk to the NDAC in increments of Iref=0.1 mA. Iref could of course comprise a different magnitude than 0.1 mA, and amplitude An could comprise a different number of increments than 256.

The PDAC is largely similar in construction to the NDAC, although operating to source a current. Again, selection transistors 56p are controlled by digital amplitude bus <Ap[8:1]>, with each transistor 56p controlling the current from different numbers of paralleled transistors 54p. Iref as produced by a generator 50p is mirrored by a transistor 52p to the transistors 54p. Because selection transistors 56p are P-channel transistors, the digital control signals Ap[i] are preferably active low. Therefore, for example, if the digital amplitude bus <Ap[8:1]>=' 11001010', i.e., the complement of 53 in binary, control signals Ap[6], Ap[5], Ap[3], and An[1] are asserted to close their associated selection transistors 56p, which respectively cause 32*Iref, 16*Iref, 4*Iref, and Iref to be sourced for a total of 53*Iref. Assuming again that Iref=0.1 mA, the current Iout sourced (e.g., to the PDAC's electrode node (FIG. 3A) or switch matrix (FIG. 3B)) would equal 5.3 mA (Note that the Iref may be trimmable at generators 50p and 50n to ensure the currents produced by the PDAC and NDAC are properly balanced). Again, by asserting various of the digital control signals in the digital amplitude bus <Ap[8:1]>, output currents Iout over a dynamic range from Iref=0.0 mA ('11111111') to 255*Iref=25.5 mA ('00000000') can be sourced from the PDAC in 256 increments of Iref=0.1 mA.

SUMMARY

A stimulator device is disclosed, which may comprise: a plurality of electrode nodes, each electrode node configured to be coupled to a corresponding electrode configured to contact a patient's tissue; and Digital-to-Analog Converter (DAC) circuitry controllable by a digital amplitude bus configured to specify a plurality of amplitude values, wherein the DAC circuitry is configured to set a magnitude of an output current at at least one of the electrode nodes in accordance with an amplitude value carried by the digital amplitude bus, wherein the magnitude of the output current increases non-linearly as the amplitude value is incremented through the plurality of amplitude values.

In one example, the magnitude of the output current varies parabolically as the amplitude value is incremented through the plurality of amplitude values. In one example, the DAC circuitry comprises at least one MOS diode with a current-voltage characteristic that is parabolic. In one example, the magnitude of the output current varies exponentially as the amplitude value is incremented through the plurality of amplitude values. In one example, the DAC circuitry comprises at least one p-n diode with a current-voltage characteristic that is exponential. In one example, a resolution of the output current is constant as the amplitude value is incremented through the plurality of amplitude values. In one example, the resolution comprises a percentage change in the magnitude of the output current as the amplitude value is incremented. In one example, the DAC circuitry is further controlled by at least one function select signal, wherein the at least one function select signal sets a relationship that dictates how the magnitude of the output increases as the amplitude value is incremented through the plurality of amplitude values. In one example, the at least one function select signal causes the magnitude the output to either (i) increase parabolically as the amplitude value is incremented through the plurality of amplitude values, or (ii) increase exponentially as the amplitude value is incremented through the plurality of amplitude values. In one example, the DAC circuitry comprises: an input stage configured to receive the digital amplitude bus and to produce a third voltage, and an output stage configured to receive the third voltage and produce the output current. In one example, the third voltage varies linearly with the amplitude value. In one example, the third voltage is impressed across a third circuit in the output stage having a non-linear current-voltage characteristic, wherein the output current is formed through the third circuit in accordance with the non-linear current-voltage characteristic. In one example, the third circuit is selectable. In one example, the input stage comprises a first biasing stage configured to produce a first voltage that varies with a first current. In one example, the first current is programmable to set a maximum magnitude for the output current. In one example, the first biasing stage comprises a first circuit configured to receive the first current, wherein the first voltage is produced in accordance with a non-linear current-voltage characteristic of the first circuit. In one example, the first circuit is selectable. In one example, the non-linear current-voltage characteristic of the first circuit is the same as the non-linear current-voltage characteristic of the third circuit. In one example, the third voltage is produced as a function of the first voltage. In one example, the input stage comprises a first biasing stage configured to produce a first voltage that varies with a first current, and a second biasing stage configured to produce a second voltage that varies with a second current. In one example, the first current is programmable to set a maximum magnitude for the output current, and wherein the second current is programmable to set a minimum magnitude for the output current. In one example, the first biasing stage comprises a first circuit configured to receive the first current, wherein the first voltage is produced in accordance with a non-linear current-voltage characteristic of the first circuit, wherein the second biasing stage comprises a second circuit configured to receive the second current, wherein the second voltage is produced in accordance with a non-linear current-voltage characteristic of the second circuit. In one example, the first and second circuits are selectable. In one example, the non-linear current-voltage characteristic of the first, second, and third circuits are the same. In one example, the third voltage is produced as a function of the first and second voltages. In one example, the third voltage equals or is between the first and second voltages.

A stimulator device is disclosed, which may comprise: a plurality of electrode nodes, each electrode node configured to be coupled to a corresponding electrode configured to contact a patient's tissue; and Digital-to-Analog Converter (DAC) circuitry controllable by a digital amplitude bus configured to specify a plurality of amplitude values, wherein the DAC circuitry is configured to set a magnitude of an output current at at least one of the electrode nodes in accordance with an amplitude value carried by the digital amplitude bus, wherein the DAC circuitry is further controlled by at least one function select signal, wherein the at least one function select signal is configured to set a relationship that dictates how the magnitude of the output current varies as the amplitude value is incremented through the plurality of amplitude values.

In one example, the at least one function select signal is configured to set the magnitude of the output current to vary parabolically as the amplitude value is incremented through the plurality of amplitude values. In one example, the at least one function select signal is configured to select the use of at least one MOS diode with a current-voltage characteristic that is parabolic. In one example, the at least one function select signal is configured to set the magnitude of the output current to vary exponentially as the amplitude value is incremented through the plurality of amplitude values. In one example, the at least one function select signal is configured to select the use of at least one p-n diode with a current-voltage characteristic that is exponential. In one example, the at least one function select signal is configured to set the magnitude of the output current to vary linearly as the amplitude value is incremented through the plurality of amplitude values. In one example, the at least one function select signal is configured to select the use of at least one resistor with a current-voltage characteristic that is linear. In one example, the at least one function select is configured to set the magnitude the output to increase (i) linearly, (ii) parabolically, or (iii) exponentially, as the amplitude value is incremented through the plurality of amplitude values. In one example, the DAC circuitry comprises: an input stage configured to receive the digital amplitude bus and to produce a third voltage, and an output stage configured to receive the third voltage and produce the output current. In one example, the third voltage varies linearly with the amplitude value. In one example, the third voltage is impressed across a selected one of a plurality of third circuits in the output stage in accordance with the at least one function select signal, wherein each of the third circuits comprises different current-voltage characteristics. In one example, the output current is formed through the selected third circuit in accordance with the current-voltage characteristic of the selected third circuit. In one example, the input stage comprises a first biasing stage configured to produce a first voltage that varies with a first current, wherein the third voltage varies with the first voltage. In one example, the first current is programmable to set a maximum magnitude for the output current. In one example, the first biasing stage comprises a plurality first circuits each comprising different current-voltage characteristics. In one example, the first voltage is produced across a selected one of the first circuits in accordance with the at least one function select signal. In one example, the first voltage is produced in accordance with the current-voltage characteristic of the selected first circuit. In one example, the input stage comprises a first biasing stage configured to produce a first voltage that varies with a first current, and a second biasing stage configured to produce a second voltage that varies with a second current, wherein the third voltage varies with the first voltage. In one example, the first current is programmable to set a maximum magnitude for the output current, and wherein the second current is programmable to set a minimum magnitude for the output current. In one example, the first biasing stage comprises a plurality first circuits each comprising different current-voltage characteristics, and wherein the second biasing stage comprises a plurality second circuits each comprising different current-voltage characteristics. In one example, the first voltage is produced across a selected one of the first circuits in accordance with the at least one function select signal, and wherein the second voltage is produced across a selected one of the second circuits in accordance with the at least one function select signal. In one example, the first voltage is produced in accordance with the current-voltage characteristic of the selected first circuit, and wherein the second voltage is produced in accordance with the current-voltage characteristic of the selected second circuit. In one example, the third voltage is produced as a function of the first and second voltages. In one example, the third voltage equals or is between the first and second voltages.

A stimulator device is disclosed, which may comprise: a plurality of electrode nodes, each electrode node configured to be coupled to a corresponding electrode configured to contact a patient's tissue; and Digital-to-Analog Converter (DAC) circuitry controllable by a digital amplitude bus configured to specify a plurality of amplitude values, wherein the DAC circuitry is configured to set a magnitude of an output current that affects an electrode current at at least one of the electrode nodes, wherein the output current is equal to or ranges between a maximum magnitude and a minimum magnitude in accordance with an amplitude value carried by the digital amplitude bus, wherein the DAC circuitry is further programmable to set the maximum magnitude and the minimum magnitude.

In one example, the DAC circuitry is configured to provide the output current as the electrode current at the at least one of the electrode nodes. In one example, the DAC circuitry comprises an amplification stage configured to amplify the output current to the electrode current. In one example, the DAC circuitry is programmable by a first bus to set the maximum magnitude for the output current, and wherein the DAC circuitry is programmable by a second bus to set the minimum magnitude for the output current. In one example, the DAC circuitry comprises: In one example, an input stage configured to receive the digital amplitude bus and to produce a third voltage, and an output stage configured to receive the third voltage and produce the output current. In one example, the third voltage varies linearly with the amplitude value. In one example, the third voltage is impressed across a third circuit in the output stage, wherein the third circuit comprises a current-voltage characteristics. In one example, the output current is formed through the third circuit in accordance with the current-voltage characteristic of the third circuit. In one example, the third circuit is selectable. In one example, the input stage comprises a first biasing stage configured to produce a first current in accordance with the set maximum magnitude, and a second biasing stage configured to produce a second current in accordance with the set minimum magnitude. In one example, the first biasing stage is configured to produce a first voltage that varies with a first current, and wherein the second biasing stage is configured to produce a second voltage that varies with a second current. In one example, the first biasing stage comprises a first circuit configured to receive the first current, wherein the first voltage is produced in accordance with a current-voltage characteristic of the first circuit, and wherein the second biasing stage comprises a second circuit configured to receive the second current, wherein the second voltage is produced in accordance with a current-voltage characteristic of the second circuit. In one example, the first and second circuits are selectable. In one example, the third voltage is produced as a function of the first and second voltages. In one example, the third voltage equals or is between the first and second voltages. In one example, the third voltage varies linearly with the amplitude value.

A stimulator device is disclosed, which may comprise: a plurality of electrode nodes, each electrode node configured to be coupled to a corresponding electrode configured to contact a patient's tissue; and Digital-to-Analog Converter (DAC) circuitry configured to provide stimulation to at least one of the plurality of electrode nodes, comprising: a first biasing stage configured to produce a first voltage that varies with a first current, a resistance block configured to receive the first voltage and a second voltage, wherein the resistance block is controllable by a digital amplitude bus to produce a third voltage that equals or is between the first and second voltages in accordance with an amplitude value carried by the digital amplitude bus, an output stage configured to receive the third voltage and to produce an output current that varies with the third voltage.

In one example, the first current is programmable. In one example, the second voltage is ground. In one example, the amplitude value sets a magnitude of the output current that equals or ranges between zero and the first current. In one example, the output current varies linearly with the amplitude value. In one example, the output current varies parabolically with the amplitude value. In one example, the output current varies exponentially with the amplitude value. In one example, the first biasing stage comprises a first circuit configured to receive the first current, wherein the first voltage is produced in accordance with a current-voltage characteristic of the first circuit. In one example, the output stage comprises a third circuit having the same current-voltage characteristic as the first circuit, wherein the third circuit receives the third voltage to produce the output current in accordance with its current-voltage characteristic. In one example, the first biasing stage comprises a plurality of first circuits selectable to receive the first current and to produce the first voltage, wherein current-voltage characteristics of the plurality of first circuits are different from each other, wherein the first voltage is produced in accordance with the current-voltage characteristic of the selected first circuit. In one example, the output stage comprises a plurality of selectable third circuits, wherein the current-voltage characteristics of the plurality of third circuits are different from each other, wherein the selected third circuit receives the third voltage to produce the output current in accordance with its current-voltage characteristic. In one example, the DAC circuit further comprises a second biasing stage configured to produce the second voltage, wherein the second voltage varies with a second current. In one example, the first and second currents are programmable. In one example, the amplitude value sets a magnitude of the output current that equals or ranges between the second current and the first current. In one example, the output current varies linearly with the amplitude value. In one example, the output current varies parabolically with the amplitude value. In one example, the output current varies exponentially with the amplitude value. In one example, the first biasing stage comprises a first circuit configured to receive the first current, wherein the first voltage is produced in accordance with a current-voltage characteristic of the first circuit, and wherein the second biasing stage comprises a second circuit configured to receive the second current, wherein the second voltage is produced in accordance with a current-voltage characteristic of the second circuit. In one example, the output stage comprises a third circuit having the same current-voltage characteristic as the first and second circuits, wherein the third circuit receives the third voltage to produce the output current in accordance with its current-voltage characteristic. In one example, the first biasing stage comprises a plurality of first circuits selectable to receive the first current and to produce the first voltage, wherein current-voltage characteristics of the plurality of first circuits are different from each other, wherein the first voltage is produced in accordance with the current-voltage characteristic of the selected first circuit, and wherein the second biasing stage comprises a plurality of second circuits selectable to receive the second current and to produce the second voltage, wherein current-voltage characteristics of the plurality of second circuits are different from each other, wherein the second voltage is produced in accordance with the current-voltage characteristic of the selected second circuit. In one example, the output stage comprises a plurality of selectable third circuits, wherein current-voltage characteristics of the plurality of third circuits are different from each other, wherein the selected third circuit receives the third voltage to produce the output current in accordance with its current-voltage characteristic. In one example, the third voltage varies linearly with the amplitude value between the first and second voltages. In one example, the output current is provided to at least one of the electrode nodes. In one example, the output current is amplified before being presented to at least one of the electrode nodes.

BRIEF DESCRIPTION OF THE DRAWINGS

FIG. 1 shows an Implantable Pulse Generator (IPG), in accordance with the prior art.

FIGS. 2A and 2B show an example of stimulation pulses producible by the IPG, in accordance with the prior art.

FIGS. 5A-5C show an improved design for an NDAC able to select, via circuits with different I-V characteristics, how the output current will vary between maximum and minimum currents in accordance with amplitude values prescribed on a digital amplitude bus.

FIGS. 6A-6B show how the output current from the NDAC varies as a function of the amplitude value when the different circuits are selected. FIGS. 6C and 6D respectively show the resulting current increment and resolution as a function of the amplitude value when the different circuits are selected.

FIGS. 11A-11C show use of the improved NDAC and PDAC to provide an output current between maximum and minimum currents.

DETAILED DESCRIPTION

Figure 3A:
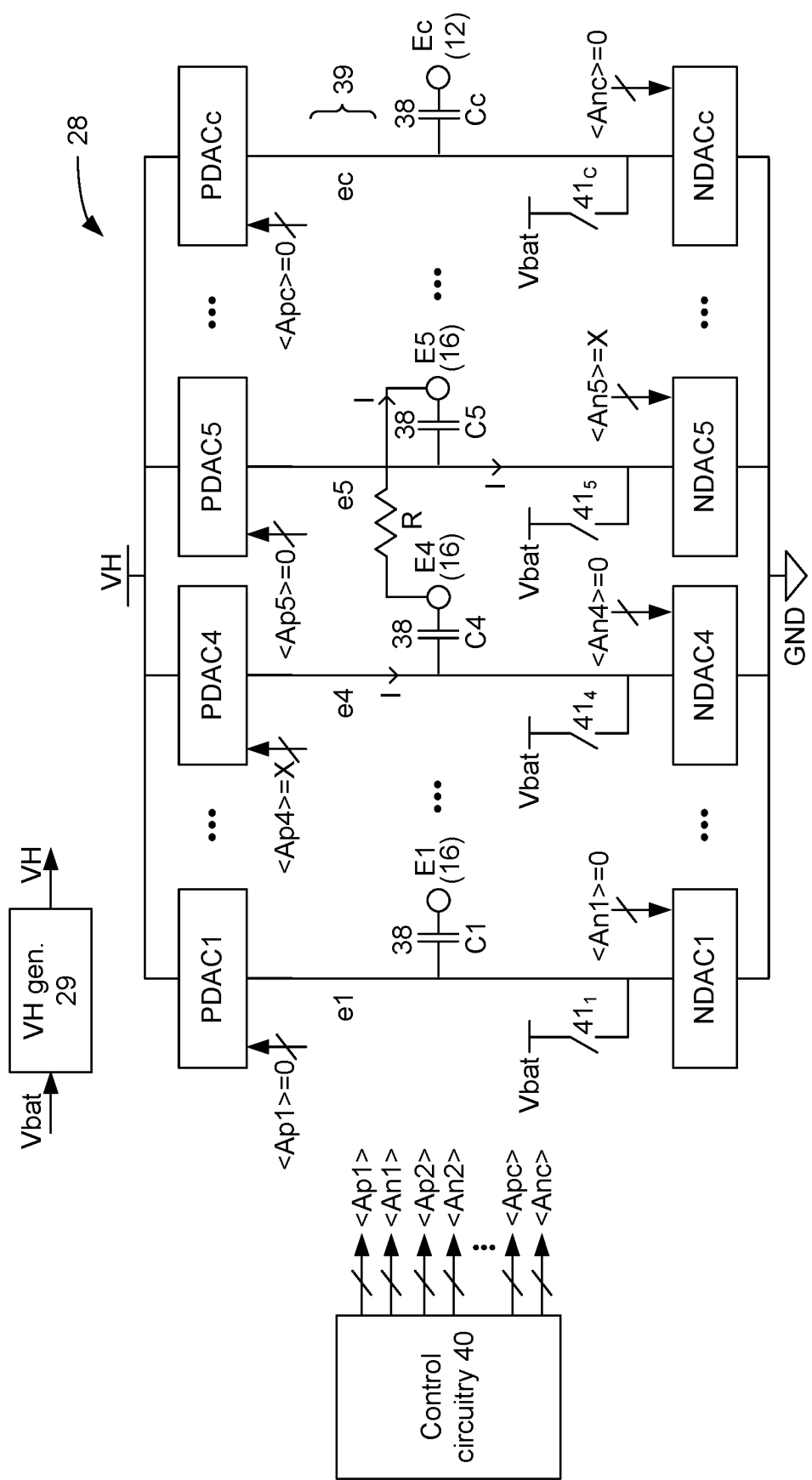
FIGS. 3A and 3B show different examples of stimulation circuitry, including PDACs and NDACs, useable in the IPG, in accordance with the prior art.

The stimulation circuitry as described earlier is beneficial in that it is programmable to provide currents of specified magnitudes and polarities at the electrodes. However, the inventor sees certain shortcomings in its Digital-to-Analog (DAC) circuitry (e.g., FIG. 4). As described previously, the magnitude of the current provided by the DACs, Iout, is incrementable in constant units of Iref (e.g., 0.1 mA), such that the output current increases or decreases by Iref each time the amplitude (the digital amplitude bus <Ap> or <An>) is increased or decreased by one. Stated differently, the output current varies linearly with the amplitude value—i.e., Iout(An)=Iref*An, and Iout(Ap)=Iref*Ap. But this increment is more significant at lower ends over the dynamic range of currents that the DACs can produce, and is less significant at higher ends of the range.

This can be non-ideal when one considers that the magnitude of the current that is optimal to provide effective therapy may vary. Sometimes lower currents (e.g., 1 mA) are required. For example, an SCS patient whose electrode array 17 is relatively close to the spinal cord may require lower currents. Lower currents may also be warranted for different types of stimulation therapy. For example, DBS applications generally require lower currents than SCS applications. Other times, higher currents (e.g., 10 mA) are required. For example, an SCS patient whose electrode array 17 is relatively far from the spinal cord may require higher currents.

The need for the DAC circuitry to provide suitable current magnitudes in these different situations complicates its design. For patients or therapies requiring lower currents, a constant current increment of 0.1 mA may be too coarse to adjust the current. This increment works a 10% resolution to a lower current magnitude of 1 mA (0.1 mA/1 mA), such that incrementing the amplitude (i.e., incrementing the digital amplitude bus) will increase the current to 1.1 mA, and decrementing the amplitude will decrease the current to 0.9 mA. This may comprise too large of a change when lower currents are required. If a patient requires a lower current such as 1 mA, smaller current adjustments may result in meaningful changes to therapy. It may therefore instead be desirable to adjust the current with a lower resolution of say 3% (an increment of 0.03 mA), such that incrementing the amplitude will increase the current to 1.03 mA, and decrementing the amplitude will decrease the current to 0.97 mA. Provider a finer resolution at lower currents would allow the clinician (via a clinician programmer) or patient (via a patient remote controller) to more flexibility to adjust the current to arrive at a suitable therapy.

For patients or therapies requiring higher currents, a constant current increment of 0.1 mA may be too fine to meaningfully adjust the current. This increment works only a 1% resolution to a higher current magnitude of 10 mA (0.1 mA/10 mA), such that incrementing the amplitude will increase the current to 10.1 mA, and decrementing the amplitude will decrease the current to 9.9 mA. This may comprise too small of a change when higher currents are required, because such increments may not meaningfully affect therapy. In this circumstance, it might be desirable to the adjust current with a higher resolution of (again) say 3% (an increment of 0.3 mA), such that incrementing the amplitude will increase the current more significantly to 10.3 mA, and decrementing the amplitude will more-significantly decrease the current to 9.7 mA.

Figure 4:
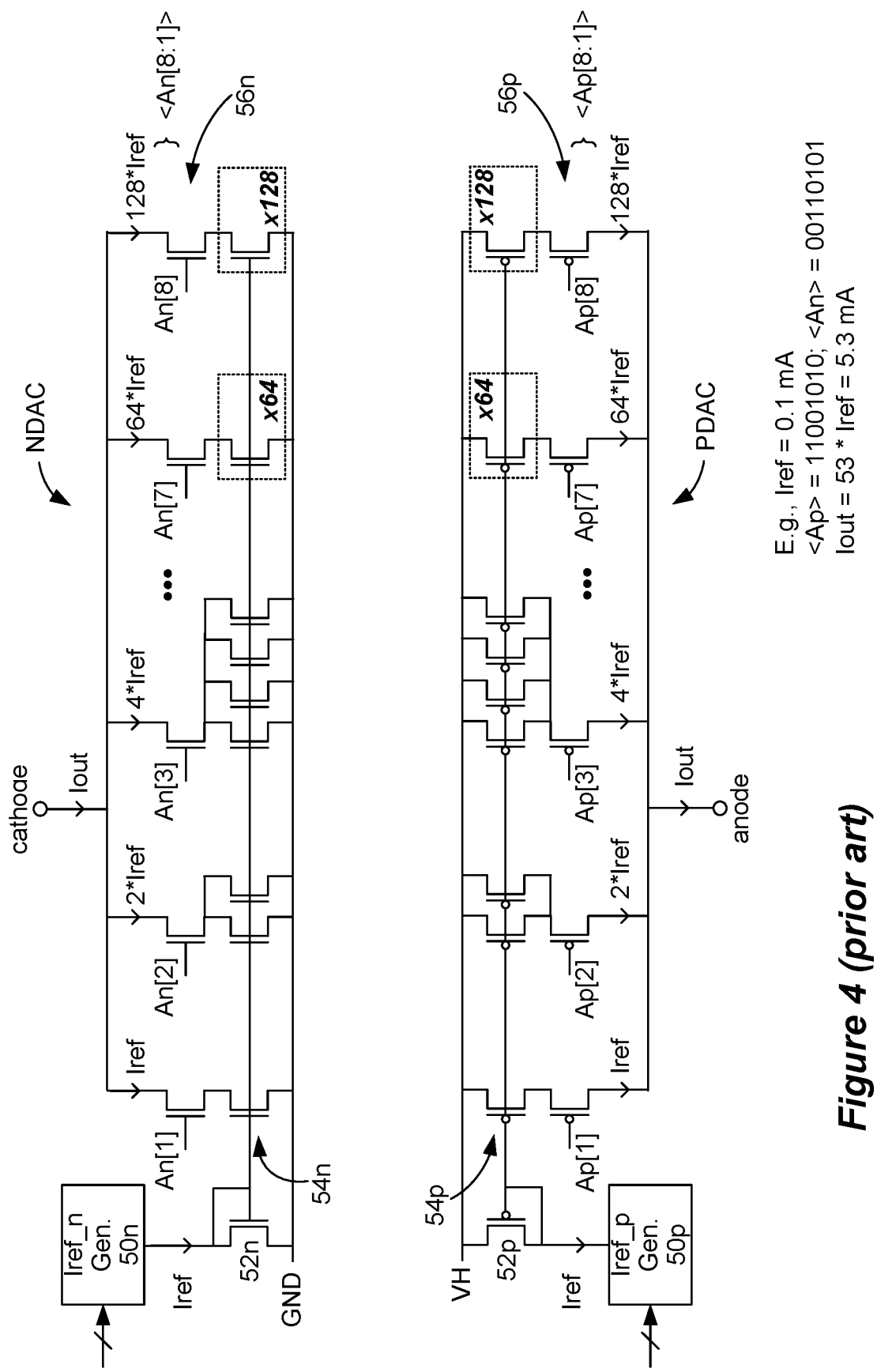
FIG. 4 shows circuit details of a PDAC and NDAC useable in the stimulation circuitries of FIGS. 3A and 3B, in accordance with the prior art.

Designing DAC circuitry such as that shown in FIG. 4 that is able to handle stimulation at lower and higher currents can thus involve undesirable trade offs. If the DAC circuitry is designed to provide a good resolution (e.g., 3%) for higher currents (e.g., 10 mA), a current increment of 0.3 mA is required. But this would provide an unsuitably high resolution (e.g., 30%) at lower currents (1 mA), and adjustments that are too coarse. By contrast, if the DAC circuitry is designed to provide a good resolution (e.g., 3%) for lower currents (e.g., 1 mA), a current increment of 0.03 mA is required. Not only would this result in an undesirably low resolution (0.3%) at higher currents (e.g., 10 mA), it would complicate DAC circuitry design. If it is assumed for example that the DAC circuitry should have a dynamic range of 25.5 mA, a current increment of 0.03 would require the amplitude to be controllable in 850 increments (25.5 mA/0.03 mA). Given the binary nature of the PDACs and NDACs (FIG. 4), the digital amplitude bus would now require additional signals, e.g., ten signals instead of eight, to properly form the currents. (Ten signal provides allows $2^{10}=1024$ different amplitudes to be specified by the digital amplitude bus, enough to handle the 850 required). This complicates DAC design, and may result in values for the amplitude bus (those from 851 to 1024) that are invalid.

Another shortcoming relating to the DAC circuitry having a constant current increment is that it may be unnecessary for a given application to use its full dynamic range. For example, suppose it is known that a given SCS patient requires currents on the order of 4 mA to provide effective therapy for their symptoms. It may never be warranted that the current magnitude for this patient be lower than 3 mA, or higher than 5 mA, such that the effective range of the DAC circuitry is from 3 mA to 5 mA for this patient. In this example, much of the dynamic range of the DAC circuitry (A<3 mA; 5<A<25.5 mA) is effectively wasted on this patient. Further, because the current increment is constant (e.g., 0.1 mA) across all amplitude values, the patient can effectively only adjust the current to 21 of 256 possible amplitude values (e.g. from 3.0 mA to 5.0 mA), which is limiting. It may be desirable to allow the patient the adjust the output current more finely within an effective range for their needs.

In short, DAC circuitry such as that described earlier may be too inflexible. It is desirable instead to provide a DAC circuitry design that can more meaningfully increment and decrement the current depending on the magnitude of that current. For example, at lower magnitudes (e.g., 1 mA), the current increment should be lower (e.g., 0.03 mA), while at higher magnitudes (e.g., 10 mA), the current increment should be higher (e.g., 0.3 mA). In short, a design that provides a constant, or at least more constant, resolution over the dynamic range is desired.

Further, it is desirable to provide a DAC circuitry design that allows the dynamic range to be set for particular patients or applications, while still preserving the ability to finely increment the current over a full range of amplitude values within that range.

Finally, it is desirable to be able to select within the DAC circuitry the use of different circuits with different current-to-voltage (I-V) characteristics to control the shape of the output current. This is because, as explained below, different I-V characteristics will have different effects on the manner in which the output current is incremented, and hence the resolution of current adjustment, over the dynamic range.

Figure 5C:
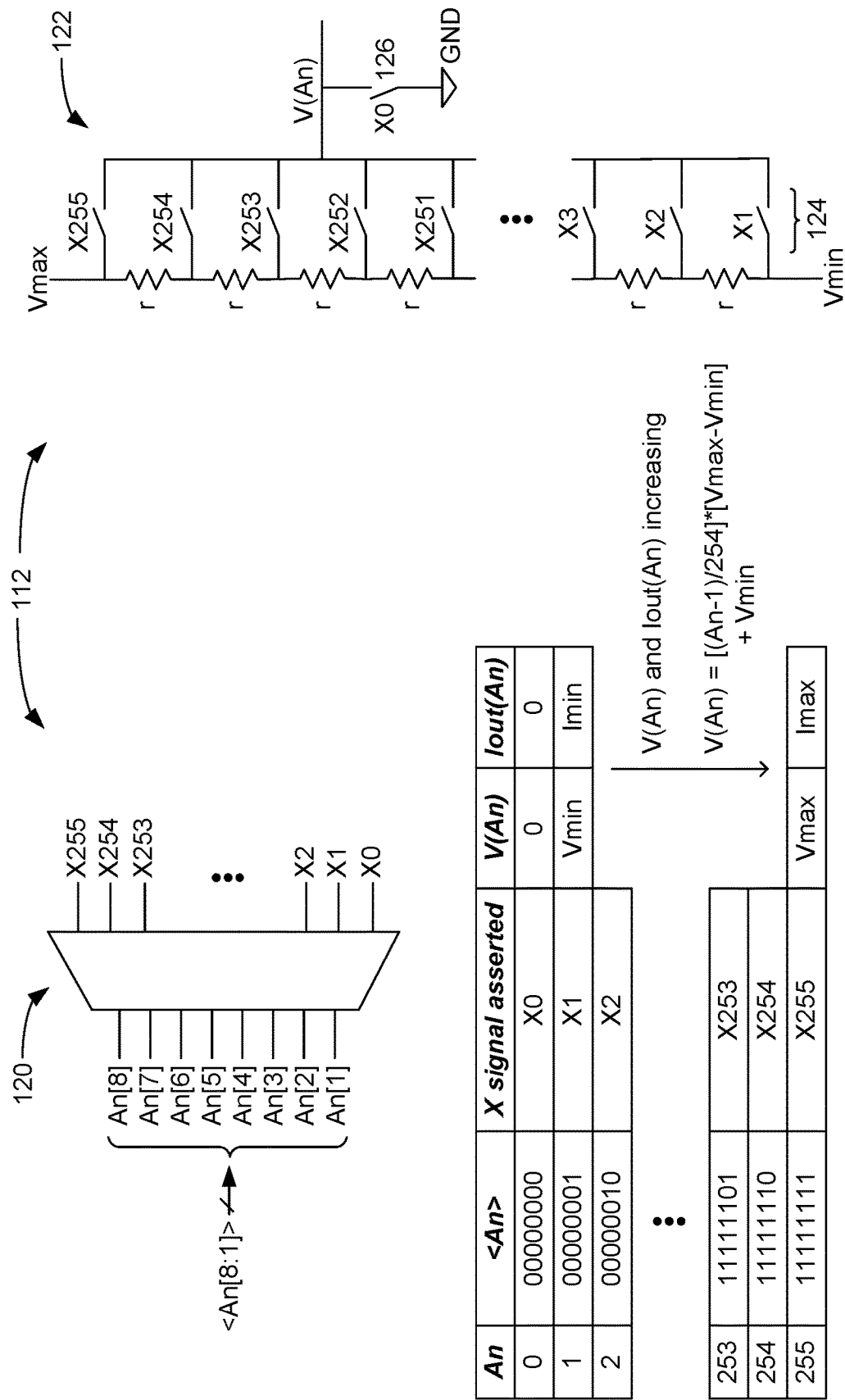
Figures 7A, 7B:
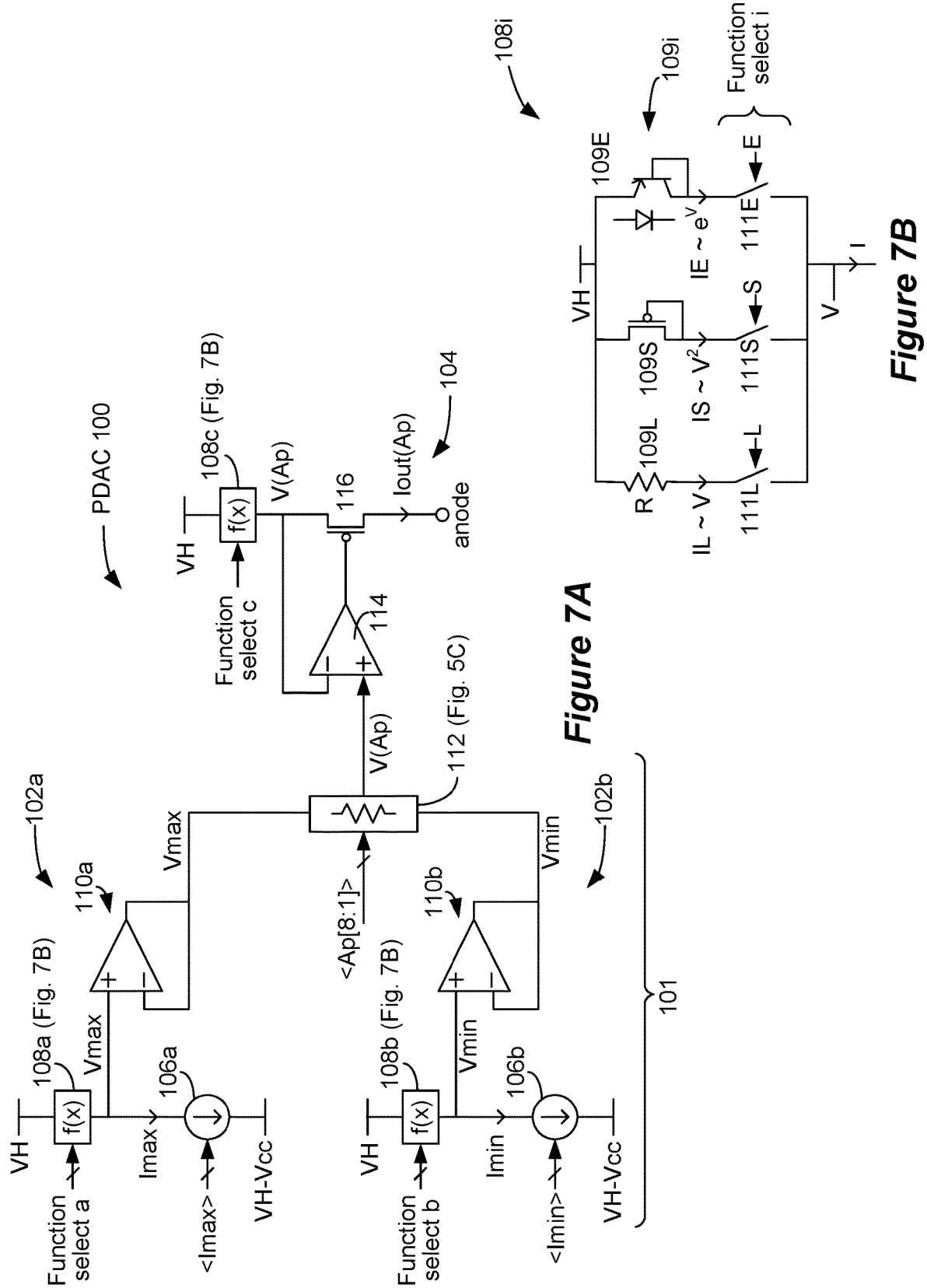
FIGS. 7A and 7B show an improved design for a PDAC similar in construction and functionality to the NDAC.

In support of these goals, a more-flexible DAC circuitry design 100 is disclosed starting with FIG. 5A. More particularly, FIG. 5A shows a new NDAC circuitry design which can sink an output current Iout from a cathode. FIGS. 7A and 7B later describe alterations to the circuitry to form a PDAC 100 which can source an output current Iout to an anode. The new DAC circuitry design can be present as part of stimulation circuitry in an IPG or in similar devices, such as an ETS device as described earlier.

As shown, the NDAC circuitry 100 receives a digital amplitude bus <An> and produces an analog output current, Iout, which is a function of the prescribed amplitude, An, carried by the bus. However, as described further below, and depending on how the NDAC 100 is programmed, the output current Iout may not necessarily linearly scale with the amplitude An. That is, Iout(An) may not be incrementable in constant current increments (such as Iref) as An is incremented, and thus Iout may not necessarily be linearly proportional to A, as occurred in the DAC circuitry described in the Introduction. The digital amplitude bus <An> is shown as a parallel bus comprising a plurality of signal lines (e.g., eight signal lines An[8]–An[1]), but could also comprise a serial bus comprising a single signal line as well.

The NDAC 100 as shown in FIG. 5A includes an input stage 101 and an output stage 104. The input stage in this example includes two biasing stages 102a and 102b. These biasing stages 102a/b can be similar in design, and are used to set the maximum (Imax) and minimum (Imin) values for the current that will be produced at the output, Iout. Each biasing stage 102a/b includes a current source 106a/b which is programmable to produce Imax/Imin. In this regard, the IPG's control circuitry 40 can issue digital buses <Imax> and <Imin> as necessary to program the current sources 106a/b to produce Imax and Imin. As with other digital buses, these buses <Imax> and <Imin> may comprise parallel or serial buses. Note that the current sources 106a/b can comprise any design for a programmable current source. For example, current sources 106a/b may be built as shown earlier in FIG. 4, or can comprise other designs such as those disclosed in U.S. Pat. Nos. 6,181,969, 8,606,362, 8,620,436, and U.S. Patent Application Publications 2018/0071520 and 2019/0083796, which were incorporated by reference above.

The maximum and minimum currents Imax and Imin are in this example provided to current-voltage (I-V) selection blocks 108a and 108b (generally 108i), which is shown in further detail in FIG. 5B. I-V selection block 108i allows different circuits 109i to be selected to receive Imax and Imin produced by the current sources 106a/b. Preferably, each of the different circuits 109i has a different current-to-voltage (I-V) characteristic, and three different circuits 109i are shown in FIG. 5B. The three illustrated circuits 109i in this example comprise single devices, although this is just for simplicity. In other examples the circuits 109i could comprise one or more devices, i.e., a network of devices, that together provide a desired I-V characteristic.

A first of the circuits 109L comprises a resistor, whose current IL is linearly proportional to the voltage across it: IL ~kV, where k equals the conductance of the resistor (1/R). A second of the circuits 109S comprises a MOS diode, which can be formed as shown by connecting the drain of a MOS transistor to its gate. As is known, the current flowing through this MOS diode, IS, is proportional to the square of the voltage across it: IS~k $(V-Vt)^2$, where k is a constant, and Vt comprises the threshold voltage of the MOS transistor. A third of the circuits 109E comprises a p-n diode, which can be formed in one example by connecting the collector of a bipolar junction transistor to its base. As is known, the current flowing through this p-n diode, IE, is exponentially proportional to voltage V across it: IE~$m*e^{n*V}$, where m and n are constants.

Any of these circuits 109L, 109S, and 109E can be selected for use within the I-V selection blocks 108i by closing switches 111L, 111S, 111E in series with each. These switches are respectively controlled by control signals L (linear), S (square), and E (exponential), which together comprise function select signals. These function select signals are issued by the control circuitry 40, and in the example shown, different function select signals a, b, and c are used to control the selection of the circuit 109i in I-V selection block 108a, I-V selection block 108b, and a third I-V selection block 108c appearing in the output stage 104, which will be discussed later. Preferably, but not necessarily, the control circuitry 40 would select the same circuit 109i in each of the I-V selection blocks 108a, 108b, and 108c. In this regard, and although not shown, the control circuitry 40 may issue only one set of function control signals—i.e., one set of L, S, and E control signals-which would be received by each of the I-V selection blocks 108a, 108b, and 108c.

In biasing stage 102a, Imax is provided to the selected circuit 109i within I-V selection block 108a, which in turn produces a voltage Vmax as governed by the I-V characteristics of the selected circuit. For example, if resistor 109L is selected, Vmax will equal Imax*R. If MOS diode 109S is selected, Vmax would be proportional to SQRT (Imax). If p-n diode 109E is selected, Vmax would be proportional to the ln(Imax). Vmax is provided to a voltage follower 110a to produce a buffered version of Vmax at its output. Biasing stage 102b is similar, with Imin provided to the selected circuit 109i within I-V selection block 108b, which in turn produces a voltage Vmin as governed by the I-V characteristics of the selected circuit. Vmin is provided to a voltage follower 110b to produce a buffered version of Vmin at its output.

Vmax and Vmin as buffered are provided to a resistance block 112 in the input stage 101, which is controlled by the digital amplitude bus <An> to produce a voltage V(An) that varies with the amplitude value An carried by the bus. An example of resistance block 112 is shown in further detail in FIG. 5C, and includes a demultiplexer (demux) 120 and a resistor ladder 122. This example assumes that digital amplitude bus <An> comprises eight control signals An[8]–An[1] and is thus capable of specifying 256 different amplitude values. The demux 120 asserts one of 256 possible X control signals in accordance with the value of An, as shown in the table in FIG. 5C. For example, if An=0 (<An>='00000000'), then demux 120 asserts signal X0; if An=1 (<An>='00000001'), then demux asserts signal X1, and so on, with X255 asserted when An=255 (<An>='11111111').

Except for the case where An=0 (discussed further below), the asserted X control signal closes a switch 124 in the resistor ladder 122 to set a value for V(An) that equals, or is between, Vmax and Vmin. The resistor ladder 122 includes a series connection of 254 resistors in this example, preferably all having the same value, r. Given the manner in which the switches 124 are connected to the resistors, voltage V(An)=[(An-1)/254] *[Vmax-Vmin]+Vmin. Thus, when An=1, X1 is asserted, which sets V(An)=Vmin. When An=255, X255 is asserted), which sets V(An)=Vmax. V(An) scales linearly between Vmin and Vmax for other values of An.

It may be desirable to reserve an amplitude that specifies that the NDAC 100 should provide no output, i.e., that Iout should equal zero (as opposed to Imin). This circumstance is reserved in the depicted example for when An=0 (<An>='00000000'). In this instance, the demux 120 asserts signal X0, which controls a switch 126 that connects V(An) to ground. This sets V(An) to zero, which in turn will set Iout to zero, as explained shortly.

Referring again to FIG. 5A, V(An) is provided to the output stage 104 of the NDAC 100. Specifically, V(An) is provided to a non-inverting input of an operational amplifier (op amp) 114, whose output is provided to the gate of an output transistor 116. The inverting input of the op amp 114 is connected to the top of I-V selection block 108c. Feedback will force the output transistor 116 on to an extent necessary to cause the voltages at the op amp's inputs to be the same; hence V(An) will be dropped across I-V selection block 108c. This voltage drop V(An) induces a current Iout through the I-V selection block 108c and the output transistor 116 in accordance with the I-V characteristics of the circuit 109i (FIG. 5B) selected in block 108c.

Operation of the NDAC 100, and relevance of selecting different of the circuits 109i, is explained with reference to FIG. 5A and FIGS. 6A-6D. In the illustrated examples, it is assumed that Imax is set (via <Imax>) to 25.5 mA, and Imin is set (via <Imin> to 0.1 mA. As noted earlier, it is preferred that the circuit 109i selected in each of the I-V selection blocks 108a-c be the same, and FIGS. 6A-6D show the examples where the resistors 109L, the MOS diodes 109S, and the p-n diodes 109E are selected in each block, via control signals L, S, and E respectively.

Each of the selectable circuits 109i in the I-V selection blocks 108i provides a different scaling to the current Iout as amplitude value An is changed. In other words, the selected circuit 109i changes the shape of Iout(An).

For example, selection of resistors 109L provides a linear response to Iout as a function of amplitude An. This results because V(An) produced by the resistance block 112 will equal V(An)=[R (An-1)/254] *[Imax-Imin]+R*Imin, where R equals the resistance of the resistors 109L. When V(An) is impressed across a resistor R in I-V selection block 108c in the output stage 104, a current Iout=[(An-1)/254] *[Imax-Imin]+Imin results. In other words, Iout is linearly proportional with the amplitude An, as best shown in FIG. 6A. Notice that Iout ranges from Imin=0.1 mA (An=1) to Imax=25.5 mA (An=255), except when An=0, which causes V (A) to be zero, which sets Iout to zero.

The selection of MOS diodes 109S provides a squared or parabolic response to Iout as a function of amplitude An. This results because V(An) produced by the resistance block 112 will be proportional to [(An-1)/254] *[SQRT (Imax)-

SQRT (Imin)]+SQRT (Imin), as dictated by the I-V characteristics for the MOS diodes 109S. V(An) is impressed across a MOS diode 109S in the I-V selection block 108c in the output stage 104, which results in a current Iout that is generally proportional to $An^2$. The mathematics here are more complicated, and may be further complicated by other secondary effects inherent in a MOS diode's I-V characteristics (such as consideration of its threshold voltage). Nonetheless, Iout generally varies proportionally with $An^2$, as FIGS. 6A and 6B show. Again, Iout ranges from Imin=0.1 mA (An=1) to Imax=25.5 mA (An=255) (except when An=0, which sets Iout to zero).

The selection of p-n diodes 109E provides an exponential response to Iout as a function of amplitude An. This results because V(An) produced by the resistance block 112 will be proportional to [(An−1)/254] *[In (Imax)−In (Imin)]+In (Imin), as dictated by the I-V characteristics for the p-n diodes 109S. V(An) is impressed across a p-n diode 109E in the I-V selection block 108c in the output stage 104, which results in a current Iout results which is proportional to Imin*(Imax/Imin)^((An−1)/254)). In other words, Iout is exponentially proportional with amplitude An. This is best shown in FIG. 6B, which plots the logarithm of Iout versus An. Again, Iout ranges from Imin=0.1 mA (An=1) to Imax=25.5 mA (An=255) (except when An=0, which sets Iout to zero).

FIG. 6C shows the amount that the output current Iout is incremented when An is incremented. Mathematically, this graph effectively shows the derivative d(Iout)/dAn of the curves provided in FIGS. 6A and 6B.

When a resistor 109L is selected, each increment in the amplitude An provides a constant increment to the output current Iout, which in this example equals 0.1 mA. (Note that this makes sense from a calculus standpoint: because Iout varies linearly with A when a resistor is used, d(Iout)/dAn should be constant). This response is similar to the stimulation circuitry described earlier (FIG. 4), which also provides a constant current increment (Iref), and thus an output current that scales linearly with amplitude (Iout=Iref*An). This may be fine for a given implementation, but as noted earlier, having DAC that only allows the output current to be adjusted in constant increments has drawbacks: the increment may be too large to provide good resolution at lower magnitudes for Iout, and too small to provide good resolution at higher magnitudes. This resolution (increment/Iout) is quantified in FIG. 6D. It can be seen that when a constant increment is used (selection of the resistors 109L), the resulting resolution is inversely proportional to A. For example, when An=10, corresponding to Iout=1 mA, the resolution is 10% (0.1 mA/1mA), and is higher at even lower values of An. When An=100, corresponding to Iout=10 mA, the resolution is 1% (0.1 mA/10 mA), and is lower at even higher values of An. As discussed earlier, this resolution may be too high at lower currents, which inhibits the ability to make finer adjustments to the current as might be required for a patient's therapy. Likewise, the resolution may be too low at higher currents, resulting in incremental changes to the current that are insignificant.

In this regard, the selection of non-linear circuits 109i to set the shape of the output current Iout can be useful, because such circuits provide smaller increments of current at lower magnitudes of Iout, and higher increments at higher magnitudes. This provides a resolution that is constant, or at least more constant, over the dynamic range of the NDAC 100.

For example, FIG. 6C shows that when a MOS diode 109S is selected, the increment scales essentially linearly with An. (Again, note that this makes sense: because Iout is generally proportional with $An^2$, d(Iout)/dAn should generally vary proportionally with An). At lower values for the current, the current increment is less than 0.1 mA, and is approximately 0.1 mA midway through the dynamic range of the NDAC 100 (at An~127). The increment increases at higher values for An, eventually reaching approximately 0.2 mA at Amax=255. FIG. 6D shows the resolution that results from the use of this non-constant increment, which is generally between 1 to 8% over the entire dynamic range of the NDAC 100. Notice that the resolution may not follow a simple trend due to secondary effect inherent in the I-V characteristics in MOS diodes. Nonetheless, when a MOS diode 109S is used, and when compared to use of a resistor 109L, the resolution is more reasonable over the entire dynamic range of NDAC 100, with smaller resolutions at lower currents, and higher resolutions at higher currents.

When a p-n diode 109E is selected, the increment varies exponentially with A, as shown in FIG. 6C. (Again, this makes sense: because Iout varies proportionally with $e^{An}$, d(Iout)/dAn should also vary proportionally with $e^{An}$). Because Iout also varies exponentially with An, the resulting resolution (FIG. 6D) is constant, approximately 2.2% in this example. In other words, each incremental amplitude adjustment to the output current raises or lowers Iout by 2.2%. If for example Iout=1 mA when An=100 (FIG. 6B), then Iout will equal 1.022 mA when An is incremented to 101. If Iout=10 mA when An=215, then Iout will equal 10.22 mA when An is incremented to 216, etc. Notice that use of a non-linear increment in this example solves the problem highlighted earlier, because the resolution is constant (e.g., 2.2%) over the entire dynamic range of the stimulation circuitry.

The NDAC 100 is beneficial in its ability to account for variations that might be present, and thus will perform predictably even in the presence of such variations. For example, there may be variations inherent in the manufacturing process used to fabricate the NDAC 100, on an ASIC for example, which may change the I-V characteristics of the circuits 109i. Further, and particularly as concerns use of MOS diodes 109S or p-n diodes 109E, the I-V characteristics may depend on temperature. Such variations would ultimately affect the voltages Vmax and Vmin that are produced by I-V selection blocks 108a and 108b. However, because these voltages Vmax and Vmin are subtracted in the resistance block 112 when forming V(An), and because V(An) is applied to a circuit 109i in I-V selection block 108c equally affected by such variations, such variations are removed or mitigated, thus resulting in values for Iout that are predictable.

Although it is preferred that the same circuit 109i be selected in each of the I-V selection blocks 108i, different circuits 109i could be selected. As one skilled will appreciate, the use of different types of circuits would create different shapes for Iout as a function of amplitude (FIGS. 6A and 6B), hence providing different Iout current increments (FIG. 6C) and resolutions (FIG. 6D) throughout the dynamic range of the DAC. For example, biasing stages 102a and 102b could be controlled to select use of p-n diodes 109E while output stage 104 is controlled to select use of a resistor 109L, which might be beneficial in a given implementation.

FIGS. 7A and 7B shows an example of PDAC 100 able to source a current Iout from an anode, and as one skilled will appreciate, the circuitry is largely similar to that of the NDAC 100, and functions similarly. A digital amplitude bus <Ap> is received, which forms a voltage V (Ap) that forms a sourced current Iout, which can vary linearly, squarely, exponentially with Ap depending on the circuits 109$i$ selected. The devices used in PDAC 100 may have different polarities. For example, P-channel or NPN transistors can be used instead of N-channel or PNP transistors used in NDAC 100. Furthermore, digital control signals (e.g., <Imax>, <Imin>, <Ap>, function select signals L, S, and E, etc.) may also be complementary (active low). Still further, and as explained in U.S. Patent Application Publications 2018/0071520, the NDAC 100 and PDAC 100 can be powered by different power supply domains. For example, while the NDAC can be powered using power supply domain Vcc/GND as shown in FIGS. 5A and 5B, the PDAC can be powered using power supply domain VH/VH-Vcc as shown in FIGS. 7A and 7B.

Figure 8:
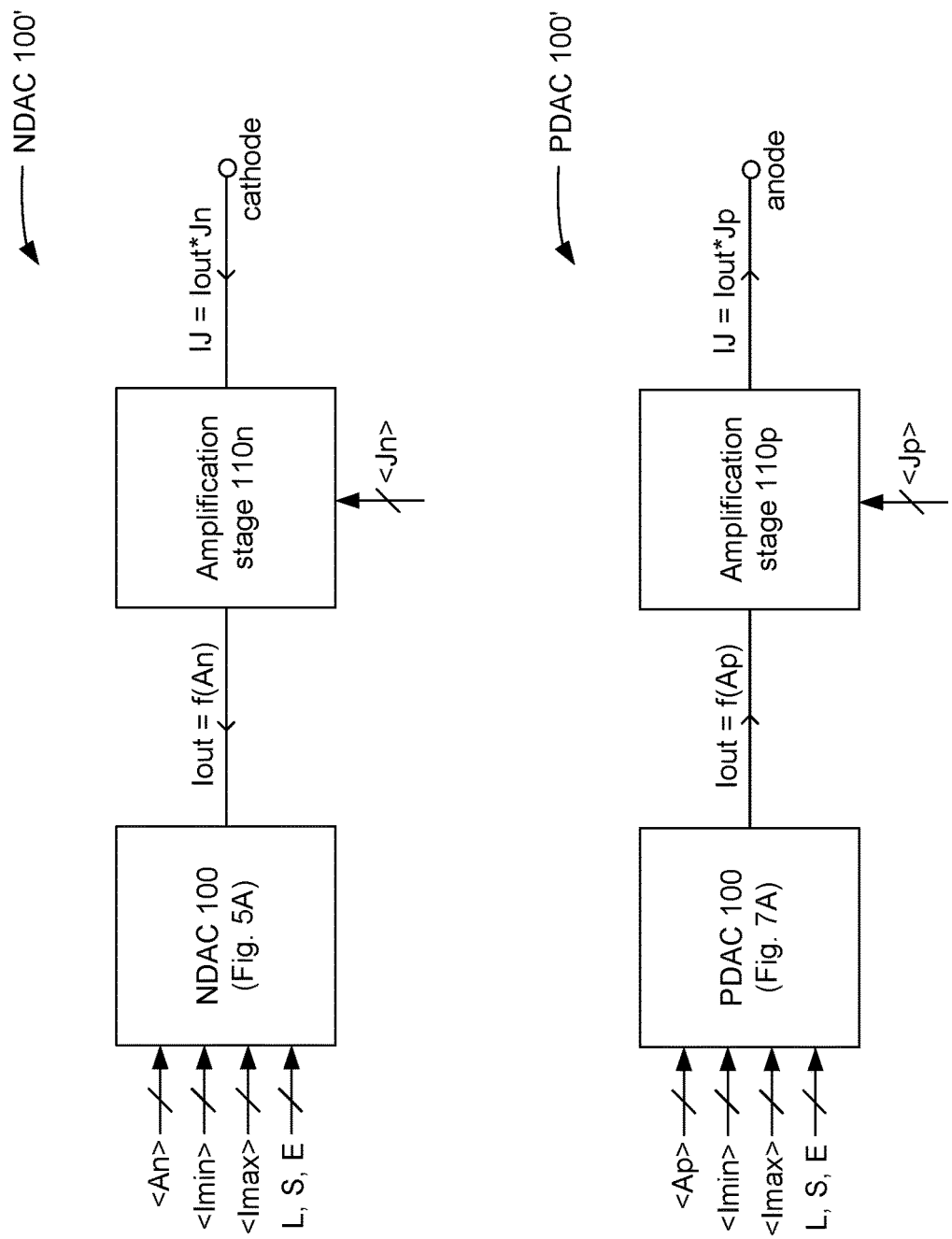
FIG. 8 shows a modification where the output of the improved NDAC and PDAC are amplified.
Figure 9:
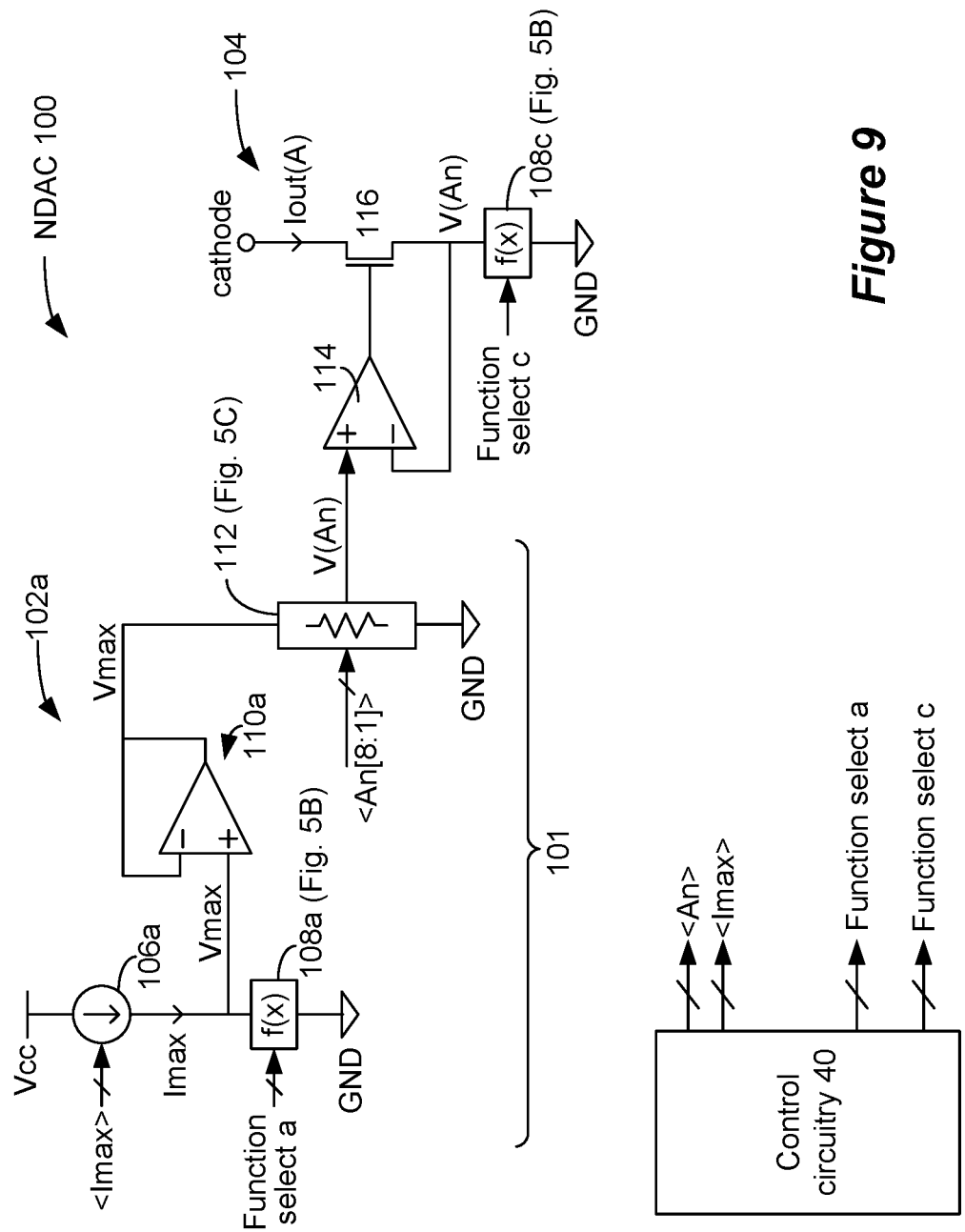
FIG. 9 shows a modification where the improved NDAC and PDAC lack a minimum-current biasing stage.
Figure 10:
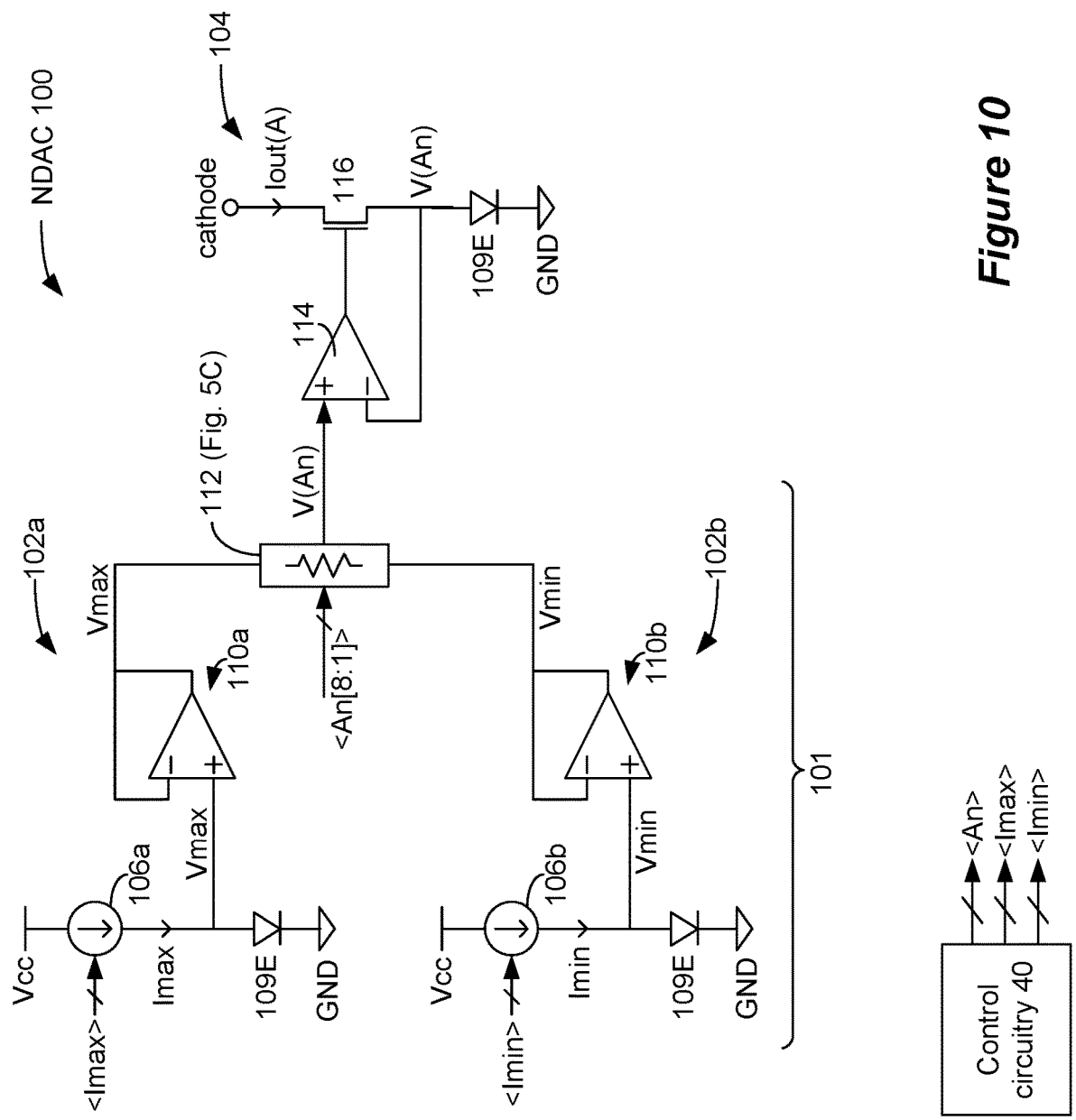
FIG. 10 shows a modification where the improved NDAC and PDAC use a single non-selectable circuit to determine how the output current will vary in accordance with the amplitude values.

Many modifications to the disclosed DAC circuitry are possible, and some different examples of modifications are shown in FIGS. 8-10. FIG. 8 shows an NDAC 100' and PDAC 100', which includes the NDAC 100 and PDAC 100 as described, but which include additional amplification stages 110$n$ and 110$p$. For example, NDAC 100' includes NDAC 100, which as described earlier receives amplitude An (via bus <An>), maximum and minimum currents Imax and Imin (via buses <Imin> and <Imax>), and function select signals (L, S, E) to select a circuit 109$i$ with desired I-V characteristics. NDAC 100 as before outputs a current Iout between Imin and Imax that varies as a function of An (either linearly, squarely, or exponentially). This output current is then provided to an amplification stage 110$n$, which (in this example) linearly amplifies Iout by a scalar Jn to produce an output current IJ=Jn*Iout at a cathode between Jn*Imin and Jn*Imax. In the example shown, scalar Jn is programmable via an amplification bus <Jn> (providable by control circuitry 40), but the amplification stage 110$n$ may also provide a fixed amplification of Jn and not be programmable. Amplification stage 110$n$ can employ current mirrors to provide the desired scalar Jn, and may be built as shown earlier in FIG. 4 for example. PDAC 100' is built similarly, and operates similarly to source a current IJ=Jp*Iout at an anode.

The modification of FIG. 9 shows use of DAC circuitry that has only a single maximum-current biasing stage 102$a$ in the input stage 101. This example is illustrated in the context of a NDAC 100, but PDAC 100 (FIG. 7A) could be similarly modified. Biasing stage 102$a$ as before is programmed to produce Imax, and in turn produce Vmax which is provided to the resistor block 112. When compared with FIG. 5A, notice that minimum-current biasing stage 102$b$ is absent, and instead the other end of the resistor block 112 is grounded. This is equivalent to setting Imin=Vmin=0 in biasing stage 102$b$. In effect then, this modification provides an output current Iout that equals or ranges between zero and Imax, which can be useful in applications where it is desirable to extend the dynamic range of currents producible by the NDAC 100 down to zero. The same effect can be achieved by setting Imax=0 in biasing stage 102$b$ in FIG. 5A. Notice that control circuitry 40 would not issue <Imin> and function select signals b (L, S, E) in this example, as these signals would be irrelevant when biasing stage 102$b$ is lacking.

FIG. 10 shows that the DAC circuitry may not have different selectable circuits 109$i$ with different I-V characteristics. This example is again illustrated in the context of a NDAC 100, but PDAC 100 (FIG. 7A) could be similarly modified. In FIG. 10, the NDAC 100 include a single non-selectable circuit 109$i$ having a I-V characteristics necessary to provide the desired response in Iout as the amplitude is varied. Specifically, FIG. 10 shows the use of p-n diodes 109E in the DAC (i.e., in place of I-V selection stages 108$i$), although other circuits (resistor 109L, MOS diode 109S) could have been illustrated as well. Use of a single non-selectable circuit 109$i$ reduces DAC flexibility in selecting how Iout will vary with amplitude, but limiting such flexibility can still be a reasonable design choice. For example, use of p-n diodes 109E are a reasonable choice if an exponential relationship between Iout and amplitude is desired to produce a constant resolution over the entire dynamic range of the DAC (FIG. 6D). Further, although not shown, the non-selectable circuits could differ in stages 102$a$, 102$b$, and 104. Notice that control circuitry 40 would not issue function select signals in this example, as these signals would be irrelevant.

The disclosed DAC circuitry is further advantageous in its ability to constrain the dynamic range of the output current Iout between minimum and maximum values, Imax and Imin, which can be useful in in a given application. Take for example the hypothetical posed earlier of an SCS patient that requires currents on the order of 4 mA. As noted earlier, it may never be warranted that the current magnitude for this patient be lower than 3 mA, or higher than 5 mA. In DAC circuitry having a fixed increment (e.g., 0.1 mA), the patient is effectively limited to small number of amplitude adjustments within this dynamic range, such as 21 out of 256 possible values.

This limitation is not present in the current DAC design, and instead the amplitude can still be varied in 256 increments within the desired dynamic range, thus providing the patient more flexibility in adjusting the current within this range. This is shown in FIGS. 11A-11C. In this example, Imin and Imax are programmed (via buses <Imin> and <Imax>) to 3 mA and 5 mA respectively to provide the desired effective dynamic range. A type of circuit 109$i$—i.e., resistor 109L, MOS diode 109S, or p-n diode 190E—is chosen to provide a desired relationship between Iout and amplitude An, as explained earlier. Notice that constraining the dynamic range of Iout can flatten the responses as shown in FIG. 11A, although these responses are still linear (resistor 109L), squared (MOS diode 190S) and exponential (p-n diode 190E) as described earlier. FIGS. 11B and 11C show the resulting increments and resolutions as a function of amplitude An, which show the same basic responses noted earlier (although again flattened). As shown in FIG. 11B, the current increment in Iout is constant (~ 0.0078 mA) when resistor 109L is used; generally linearly increasing when MOS diode 109S is used; and exponentially increasing when p-n diode 109E is used. As shown in FIG. 11C, the resolution inversely decreases when resistor 109L is used, and is constant (~ 0.2%) when p-n diode 109E is used. (The resolution for the MOS diode 109S is not shown in FIG. 11C for simplicity).

Figure 3B:
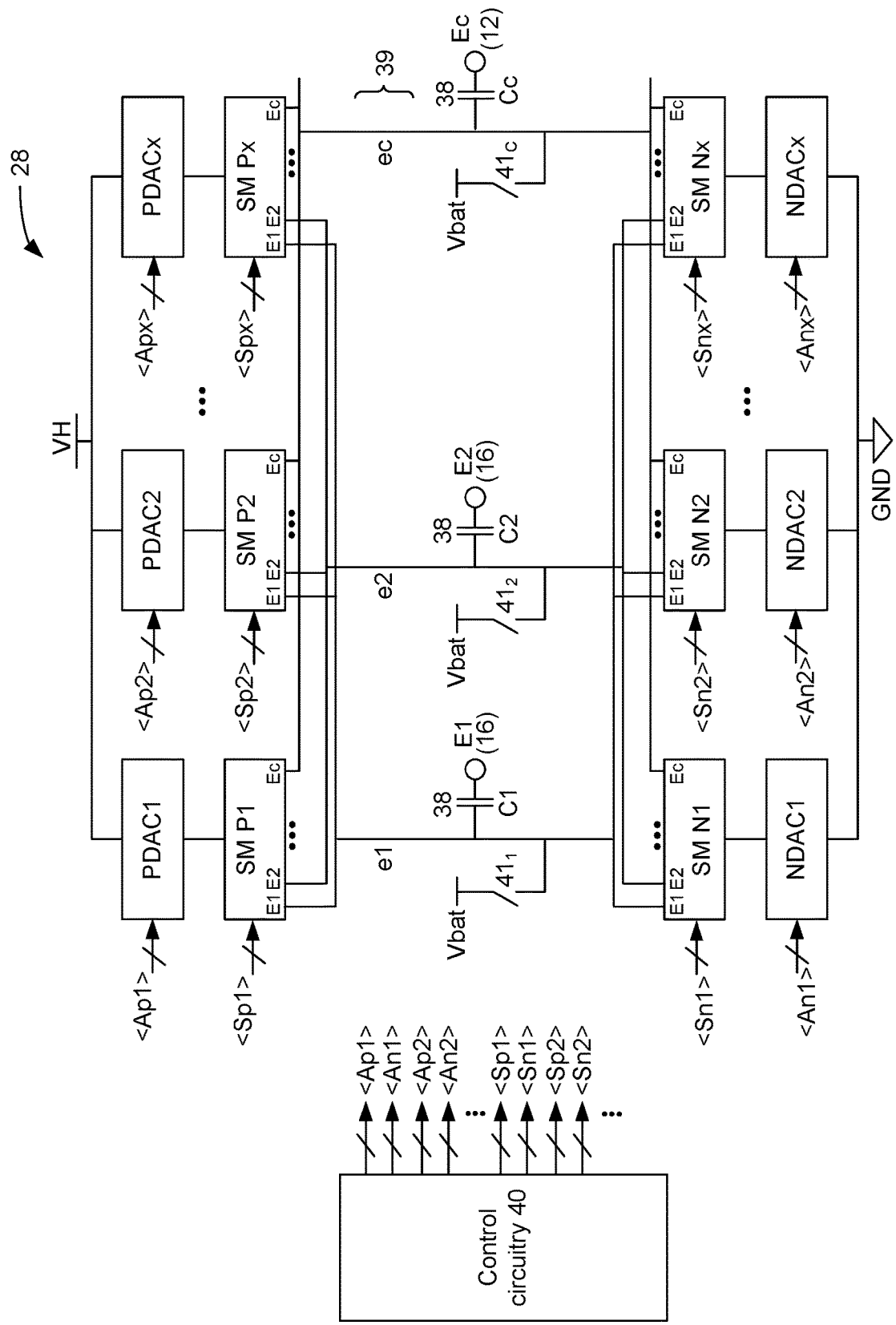
Figure 12A:
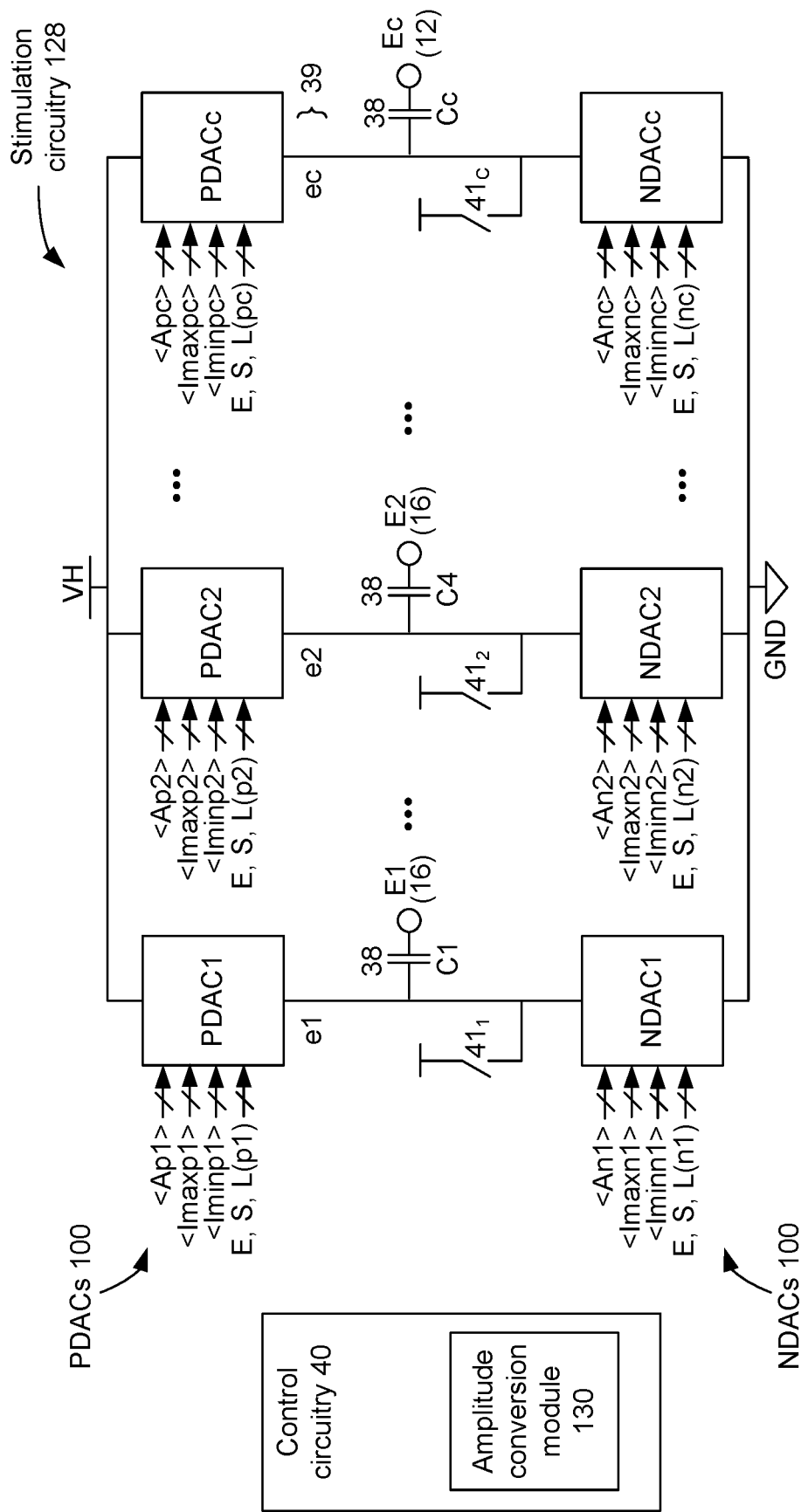
FIGS. 12A and 12B show examples of stimulation circuitry in an IPG using any of the previously described improved NDACs and PDACs.
Figure 12B:
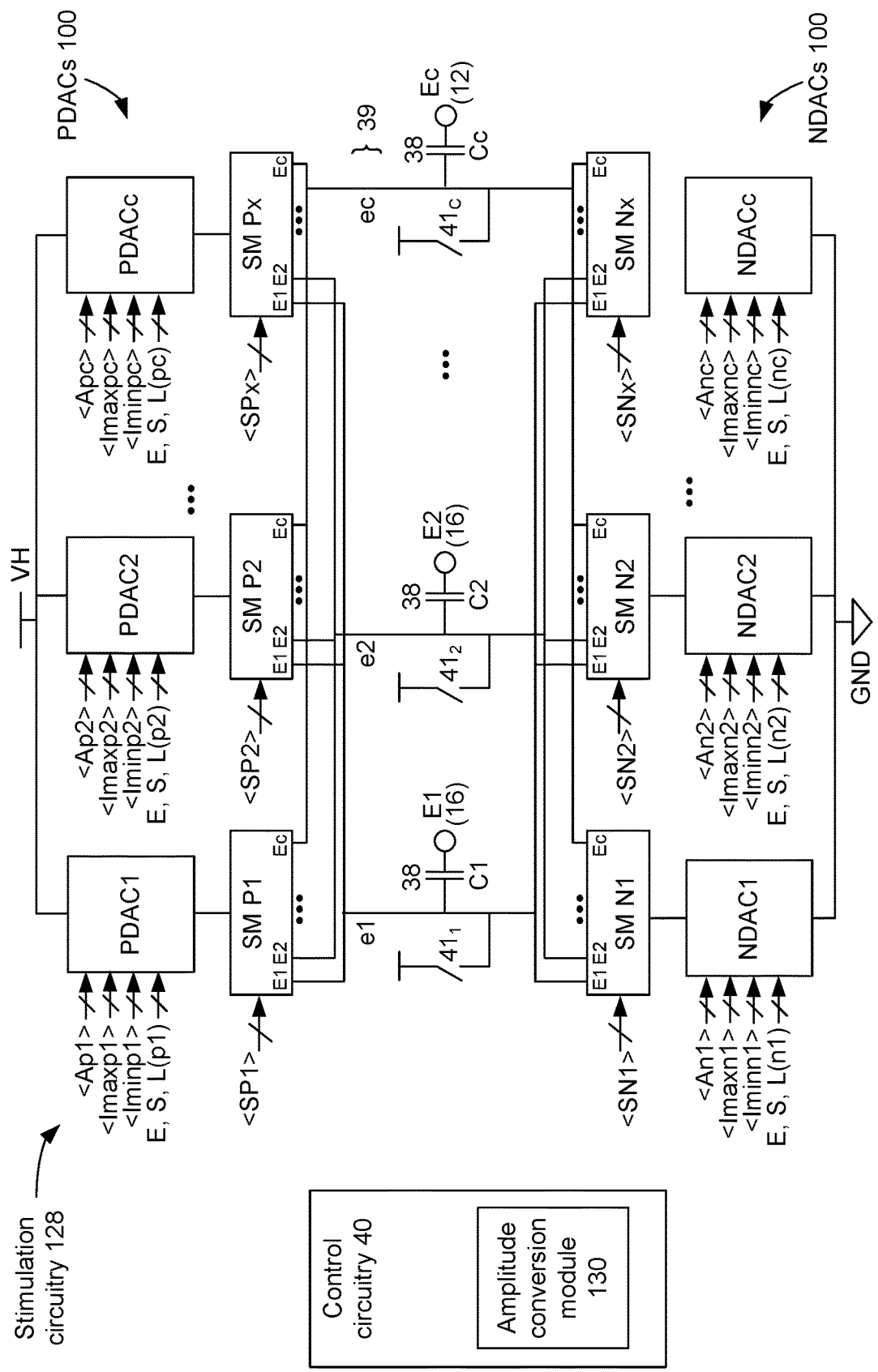

FIGS. 12A and 12B shows the integration of the disclosed NDAC 100 and PDAC 100 in a stimulation circuitry 128 used to provide currents to an IPG's electrodes. These stimulation circuitries 128 are similar to the stimulation circuitries shown earlier in FIGS. 3A and 3B, and show examples in which PDACi/NDACi pairs are dedicated to particular electrode nodes ei (FIG. 12A), and in which PDACs and NDACs can control the current at different electrodes through switch matrices SM Pi and SM Ni (FIG. 12B). Further shown are the control signals received by the various components, which as noted earlier can issue from the IPG's control circuitry 40. In the examples shown, each PDACi and NDACi receives a digital amplitude bus <Api> and <Ani>. Each PDACi and NDACi can further receive control signals unique to the disclosed DAC design, such as those to set the maximum and minimum currents (<Imaxpi>, <Iminpi>, <Imaxni>, <Iminni>), and the function select signals (L, S, E (pi), and L, S, E(ni)) used to shape Iout. In one example, the maximum and minimum currents, and the function select signals may be the same for each of the PDACs and NDACs. In this regard, the control circuitry 40 may only need to issue, and each PDACi and NDACi may receive, one set of such signal (i.e., <Imax>, <Imin>, and L, S, or E). In FIG. 12B, the switch matrices SM Pi and SW Ni additionally receive switch matrix control signals <SPi> and <SNi> as before.

Figure 13:
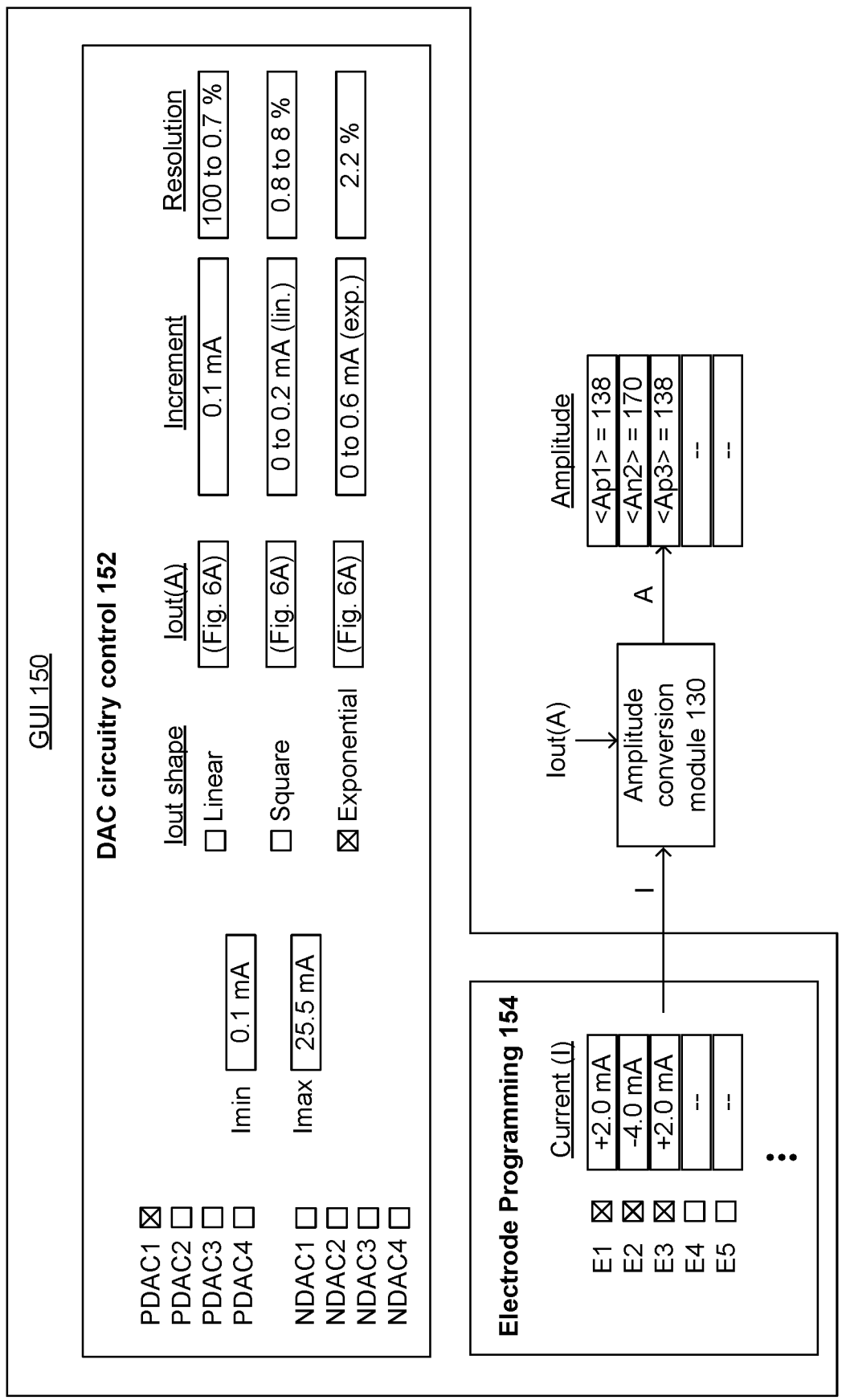
FIG. 13 shows a graphical user interface renderable on an external device able to program the IPG, where the GUI includes options to program the improved NDAC and PDAC circuitry.

FIG. 13 shows a graphical user interface (GUI 150) that can be used to program and control operation of the disclosed DAC circuitry. One skilled will understand that the GUI 150 can be rendered on the display of an external devices used to program or monitor the IPG, such as a hand-held patient remote controller or a clinician programmer. The software used to render GUI 150 and to receive inputs from the user can be stored in a non-transitory computer-readable medium, such as in memory in the external device.

The GUI 150 can include a DAC circuitry control interface 152 that allows one or more of the PDACs and NDACs to be selected and programmed. In FIG. 13, it is assumed that the IPG's stimulation circuitry 128 includes four PDACs and four NDACs, although this number could vary depending on the design of the stimulation circuitry. DAC programming can include options to specify the maximum and minimum currents to be produced by the relevant DAC(s), Imax and Imin, and options to select the shape of the Iout versus amplitude, such as linearly, squarely, or exponentially, which would respectively select the use of resistors 109L, MOS diodes 109S, and p-n diodes 109E in the stimulation circuitry 128. Such programming can be transmitted from the external device to the IPG to allow the IPG's control circuitry 40 to form buses <Imax>, <Imin>, and the function select signals L, S, and E for each or all of the DACs. (In other DAC designs, <Imin> and the function select signals may not be relevant (see FIGS. 9 and 10), in which case control for such variables could be omitted from the GUI 150).

Because the external device can be programmed with the relevant I-V characteristics of the circuits 109i used in the DAC circuitry, the external device can compute the current Iout corresponding to each amplitude value (Iout(A)) given Imin, Imax, and the selected Iout shape. In effect, the external device can determine the data necessary to form the graphs shown earlier in FIG. 6A, which shows Iout versus A. If necessary or useful, Iout(A) can be displayed in the GUI 150 as a table of values, or it could be graphed as in FIG. 6A. From the Iout(A) data, the external device can further determine the increment and the resolution, or ranges for both, as described previously. In effect, the external device can determine the data necessary to form the graphs shown earlier in FIGS. 6C and 6D, and such data may again be graphed. The displaying of such information in GUI 150 can be useful to review, and can aid the user in the selection of a proper Iout shape given Imin and Imax. For example, the user can review the resolution provided over the dynamic range of selectable amplitudes to ensure that each amplitude increment will provide a significant adjustment to Iout.

Establishing Iout(A) in the external device can also be useful to enable the external device to convert desired currents magnitudes into amplitude values A that will be carried by the digital amplitude buses (<Ap>, <An>) in the DACs. In this regard, GUI 150 can include an electrode programming interface 154 that allows a user (patient or clinician) to specify currents I to be produced at each of the electrodes in the IPG electrode array 17. In an actual implementation, the electrode programming interface 154 could be significantly more complicated and could include additional options to specify the stimulation that the patient will receive. For example, frequency and pulse width of the pulses could also be specified, but this isn't shown for simplicity.

In the example shown, the user has selected electrodes E1 and E3 to act as anodes, with each sourcing +2.0 mA to the patient's tissue. The user has also selected electrode E2 to act as a cathode to sink -4.0 mA from the patient's tissue. Knowing how Iout scales with amplitude (Iout(A)) for the selected Iout shape, the external device can determine an amplitude value A needed to establish a desired current I, and this can occur using an amplitude conversion module 130 stored in the external device in association with the GUI 150's software. Assume for example that the stimulation circuitry 128 architecture of FIG. 12A is used (with each electrode Ei having a dedicated PDACi/NDACi pair), and that the user has programmed the DACs to provide an exponential response to Iout. As noted above, the external device can determine Iout(A), and provide this to the amplitude conversion module 130 so that amplitude values A can be determined for each of the specified currents I. Referring to the graph of Iout v. A in FIG. 6C when an exponential shape is selected, we can see that currents of 2 mA and 4 mA correspond to amplitude values of 138 and 170 respectively. As such, the amplitude conversion module can set digital amplitude bus <Ap1> (servicing PDAC1 and electrode E1) to 138 ('01110101', 138 active low), digital amplitude bus <An2> (servicing NDAC2 and electrode E2) to 170 ('10101010', 170 active high), and digital amplitude bus <Ap3> (servicing PDAC3 and electrode E3) to 138 ('01110101', 138 active low). These amplitude values can then be transmitted from the external device to the IPG along with the other relevant data to allow the control circuitry 40 in the IPG to form the control signals necessary for the stimulation circuitry 128 to form the desired stimulation.

Alternatively, the external device can transmit the desired current magnitudes to the IPG 10, leaving it to the IPG 10 to convert these currents to amplitude values. In this regard, the IPG's control circuitry 40 can also include an amplitude conversion module 130, as shown in FIGS. 12A and 12B. Thus, the control circuitry 40 in the IPG 10 can determine Iout(A) given the other user selections in the GUI 150 (Imin, Imax, Iout shape, etc.), or Iout(A) can also be telemetered to the IPG. In either case, the module 130 can determine the amplitude values A necessary to form the desired currents I at each of the electrodes.

Although particular embodiments of the present invention have been shown and described, the above discussion is not intended to limit the present invention to these embodiments. It will be obvious to those skilled in the art that various changes and modifications may be made without departing from the spirit and scope of the present invention. Thus, the present invention is intended to cover alternatives, modifications, and equivalents that may fall within the spirit and scope of the present invention as defined by the claims.

What is claimed is:

1. A stimulator device, comprising:
a plurality of electrode nodes, each electrode node configured to be coupled to a corresponding electrode configured to contact a patient's tissue; and
Digital-to-Analog Converter (DAC) circuitry controllable by a digital amplitude bus configured to specify a plurality of amplitude values, wherein the DAC circuitry is configured to set a magnitude of an output current at at least one of the electrode nodes in accordance with an amplitude value carried by the digital amplitude bus,
wherein the DAC circuitry is further controlled by at least one function select signal, wherein the at least one function select signal sets a non-linear relationship that dictates how the magnitude of the output current increases as the amplitude value is incremented through the plurality of amplitude values.

2. The stimulator device of claim 1, wherein the magnitude of the output current varies parabolically as the amplitude value is incremented through the plurality of amplitude values.

3. The stimulator device of claim 1, wherein the magnitude of the output current varies exponentially as the amplitude value is incremented through the plurality of amplitude values.

4. The stimulator device of claim 1, wherein a resolution of the output current is constant as the amplitude value is incremented through the plurality of amplitude values.

5. The stimulator device of claim 4, wherein the resolution comprises a percentage change in the magnitude of the output current as the amplitude value is incremented.

6. The stimulator device of claim 1, wherein the at least one function select signal causes the magnitude of the output current to either (i) increase parabolically as the amplitude value is incremented through the plurality of amplitude values, or (ii) increase exponentially as the amplitude value is incremented through the plurality of amplitude values.

7. The stimulator device of claim 1, wherein the DAC circuitry comprises:
an input stage configured to receive the digital amplitude bus and to produce a first voltage, and
an output stage configured to receive the first voltage and produce the output current.

8. The stimulator device of claim 7, wherein the first voltage varies linearly with the amplitude value.

9. The stimulator device of claim 7, wherein the first voltage is impressed across a third circuit in the output stage having a non-linear current-voltage characteristic, wherein the output current is formed through the third circuit in accordance with the non-linear current-voltage characteristic.

10. The stimulator device of claim 9, wherein the third circuit is selectable using the at least one function select signal.

11. The stimulator device of claim 9, wherein the input stage comprises a first biasing stage configured to produce a second voltage that varies with a first current, wherein the first current is programmable to set a maximum magnitude for the output current.

12. The stimulator device of claim 11, wherein the first biasing stage comprises a first circuit configured to receive the first current, wherein the second voltage is produced in accordance with a non-linear current-voltage characteristic of the first circuit.

13. The stimulator device of claim 12, wherein the first circuit is selectable.

14. The stimulator device of claim 12, wherein the non-linear current-voltage characteristic of the first circuit is the same as the non-linear current-voltage characteristic of the third circuit.

15. The stimulator device of claim 9, wherein the input stage comprises a first biasing stage configured to produce a second voltage that varies with a first current, and a second biasing stage configured to produce a third voltage that varies with a second current.

16. The stimulator device of claim 15, wherein the first current is programmable to set a maximum magnitude for the output current, and wherein the second current is programmable to set a minimum magnitude for the output current.

17. The stimulator device of claim 15, wherein the first biasing stage comprises a first circuit configured to receive the first current, wherein the second voltage is produced in accordance with a non-linear current-voltage characteristic of the first circuit, wherein the second biasing stage comprises a second circuit configured to receive the second current, wherein the third voltage is produced in accordance with a non-linear current-voltage characteristic of the second circuit.

18. The stimulator device of claim 17, wherein the non-linear current-voltage characteristic of the first, second, and third circuits are the same.

19. The stimulator device of claim 15, wherein the first voltage is produced as a function of the second and third voltages, and wherein the first voltage equals or is between the second and third voltages.

* * * * *